(12) United States Patent
Lin et al.

(10) Patent No.: US 11,973,164 B2
(45) Date of Patent: *Apr. 30, 2024

(54) LIGHT-EMITTING DEVICE

(71) Applicant: EPISTAR CORPORATION, Hsinchu (TW)

(72) Inventors: Che-Hung Lin, Hsinchu (TW); Chien-Chih Liao, Hsinchu (TW); Chi-Shiang Hsu, Hsinchu (TW); De-Shan Kuo, Hsinchu (TW); Chao-Hsing Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/092,578

(22) Filed: Jan. 3, 2023

(65) Prior Publication Data

US 2023/0155056 A1 May 18, 2023

Related U.S. Application Data

(63) Continuation of application No. 17/496,155, filed on Oct. 7, 2021, now Pat. No. 11,575,070, which is a continuation of application No. 16/673,008, filed on Nov. 4, 2019, now Pat. No. 11,145,789.

(51) Int. Cl.
*H01L 33/08* (2010.01)
*H01L 33/10* (2010.01)
*H01L 33/38* (2010.01)

(52) U.S. Cl.
CPC .............. *H01L 33/08* (2013.01); *H01L 33/10* (2013.01); *H01L 33/385* (2013.01)

(58) Field of Classification Search
CPC ........ H01L 33/08; H01L 33/10; H01L 33/385
USPC .......................................................... 257/98
See application file for complete search history.

(56) References Cited

U.S. PATENT DOCUMENTS

| | | |
|---|---|---|
| 11,575,070 B2 * | 2/2023 | Lin ................. H01L 33/385 |
| 2014/0124730 A1 | 5/2014 | Choi et al. |
| 2016/0043290 A1 | 2/2016 | Sogo et al. |

* cited by examiner

*Primary Examiner* — Calvin Y Choi
(74) *Attorney, Agent, or Firm* — Muncy, Geissler, Olds & Lowe, P.C.

(57) ABSTRACT

A light-emitting device includes a substrate including a top surface; a semiconductor stack including a first semiconductor layer, an active layer and a second semiconductor layer formed on the substrate, wherein a portion of the top surface is exposed; a distributed Bragg reflector (DBR) formed on the semiconductor stack and contacting the portion of the top surface of the substrate; a metal layer formed on the distributed Bragg reflector (DBR), contacting the portion of the top surface of the substrate and being insulated with the semiconductor stack; and an insulation layer formed on the metal layer and contacting the portion of the top surface of the substrate.

20 Claims, 18 Drawing Sheets

LIGHT-EMITTING DEVICE

REFERENCE TO RELATED APPLICATION

This application is a continuation application of U.S. patent application Ser. No. 17/496,155, filed on Oct. 7, 2021, which is a continuation application of U.S. patent application Ser. No. 16/673,008, filed on Nov. 4, 2019, now issued.

TECHNICAL FIELD

The application relates to a light-emitting device, and more particularly, to a light-emitting device including a plurality of light-emitting elements and a connecting electrode portion formed between the plurality of light-emitting elements.

DESCRIPTION OF BACKGROUND ART

Light-Emitting Diode (LED) is a solid-state semiconductor light-emitting device, which has the advantages of low power consumption, low heat generation, long working lifetime, shockproof, small volume, fast reaction speed and good photoelectric property, such as stable emission wavelength. Therefore, light-emitting diodes are widely used in household appliances, equipment indicators, and optoelectronic products.

SUMMARY OF THE APPLICATION

A light-emitting device includes a substrate including a top surface; a semiconductor stack including a first semiconductor layer, an active layer and a second semiconductor layer formed on the substrate, wherein a portion of the top surface of the substrate is exposed; a distributed Bragg reflector (DBR) formed on the semiconductor stack and contacting the portion of the top surface of the substrate; a metal layer formed on the distributed Bragg reflector (DBR), contacting the portion of the top surface of the substrate and being insulated with the semiconductor stack; and a passivation layer formed on the metal layer and contacting the portion of the top surface of the substrate.

A light-emitting device includes a substrate; a plurality of light-emitting elements formed on the substrate, wherein the plurality of light-emitting elements includes a first plurality of light-emitting elements arranged on a first column and a second plurality of light-emitting elements arranged on a second column; a plurality of lower electrodes formed on the plurality of light-emitting elements; a plurality of upper electrodes formed on the plurality of light-emitting elements; a plurality of bottom electrode portions formed on the plurality of lower electrodes; and a plurality of top electrode portions formed on the plurality of upper electrodes, wherein in a top view of the light-emitting device, the plurality of bottom electrode portions each includes a first surface area smaller than a second surface area of each of the plurality of top electrode portions.

A light-emitting device includes a substrate including a top surface; a plurality of light-emitting elements formed on the substrate, wherein the plurality of light-emitting elements includes a first plurality of light-emitting elements arranged on a first column, a second plurality of light-emitting elements arranged on a second column, and the first plurality of light-emitting elements and the second plurality of light-emitting elements are separated by a trench, wherein each of the plurality of light-emitting elements includes a first semiconductor layer, a second semiconductor layer, and an active layer formed between the first semiconductor layer and the second semiconductor layer, wherein the first plurality of light-emitting elements includes a first light-emitting element, and the second plurality of light-emitting elements includes a second light-emitting element; a first lower electrode formed on the first semiconductor layer of the first light-emitting element; a first upper electrode formed on the second semiconductor layer of the first light-emitting element; and a first bottom electrode portion contacting the first lower electrode and a first top electrode portion contacting the first upper electrode, wherein the first bottom electrode portion covers the first light-emitting element and the second light-emitting element and/or the first top electrode portion covers the first light-emitting element and the second light-emitting element.

A light-emitting device includes a substrate; a plurality of light-emitting elements formed on the substrate, wherein the plurality of light-emitting elements includes a first plurality of light-emitting elements arranged on a first column, a second plurality of light-emitting elements arranged on a second column, and the first plurality of light-emitting elements and the second plurality of light-emitting elements are separated by a trench; a plurality of lower electrodes formed on the plurality of light-emitting elements; a plurality of upper electrodes formed on the plurality of light-emitting elements; a plurality of bottom electrode portions formed on the plurality of lower electrodes and covering the trench; and a plurality of top electrode portions formed on the plurality of upper electrodes.

A light-emitting device includes a substrate; a plurality of light-emitting elements formed on the substrate, wherein the plurality of light-emitting elements includes a first plurality of light-emitting elements arranged on a first column, a second plurality of light-emitting elements arranged on a second column, and the first plurality of light-emitting elements and the second plurality of light-emitting elements are separated by a trench; a plurality of lower electrodes formed on the plurality of light-emitting elements; a plurality of upper electrodes formed on the plurality of light-emitting elements; a plurality of bottom electrode portions formed on the plurality of lower electrodes; and a plurality of top electrode portions formed on the plurality of upper electrodes and covering the trench.

DETAILED DESCRIPTION OF PREFERRED EMBODIMENTS

Figure 1:
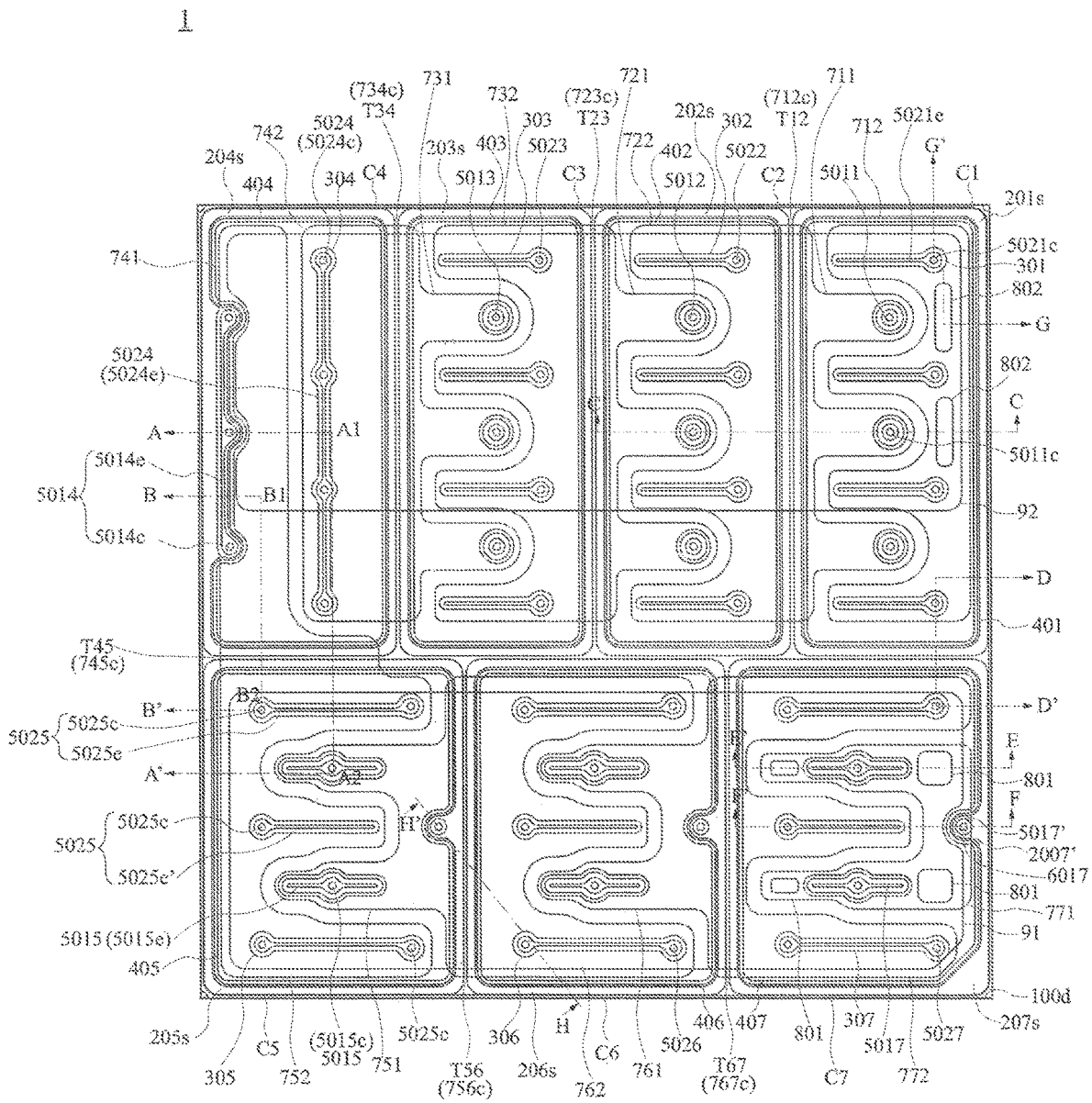
FIG. 1 illustrates a top view of a light-emitting device 1 in accordance with an embodiment of the present application.

The embodiment of the application is illustrated in detail, and is plotted in the drawings. The same or the similar part is illustrated in the drawings and the specification with the same number.

Figure 2:
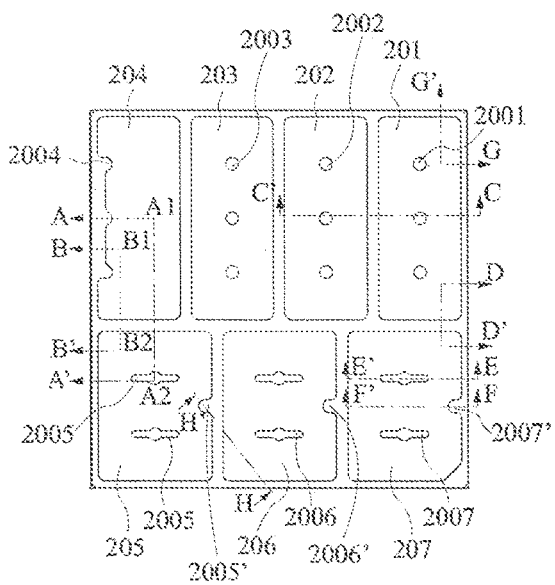
FIG. 2 illustrates top views of layers of the light-emitting device 1 of FIG. 1.
Figure 2:
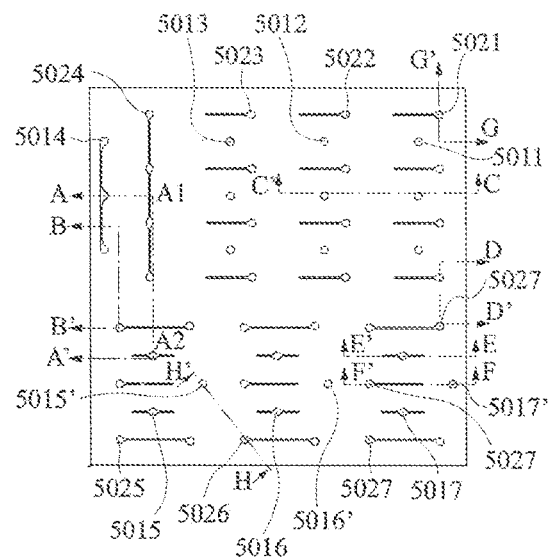
Figure 2:
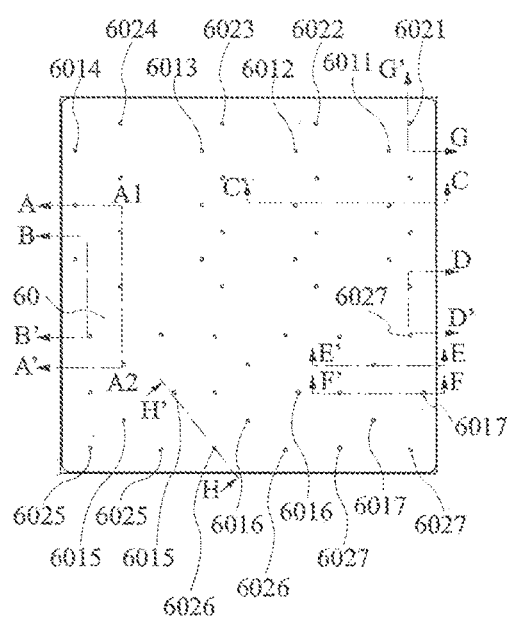
Figure 2:
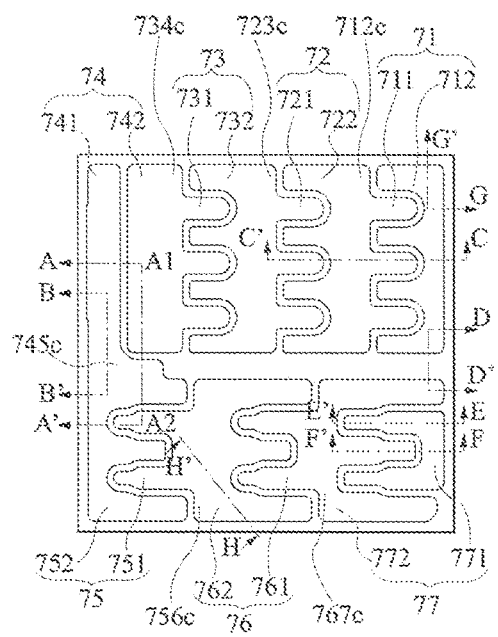
Figure 3:
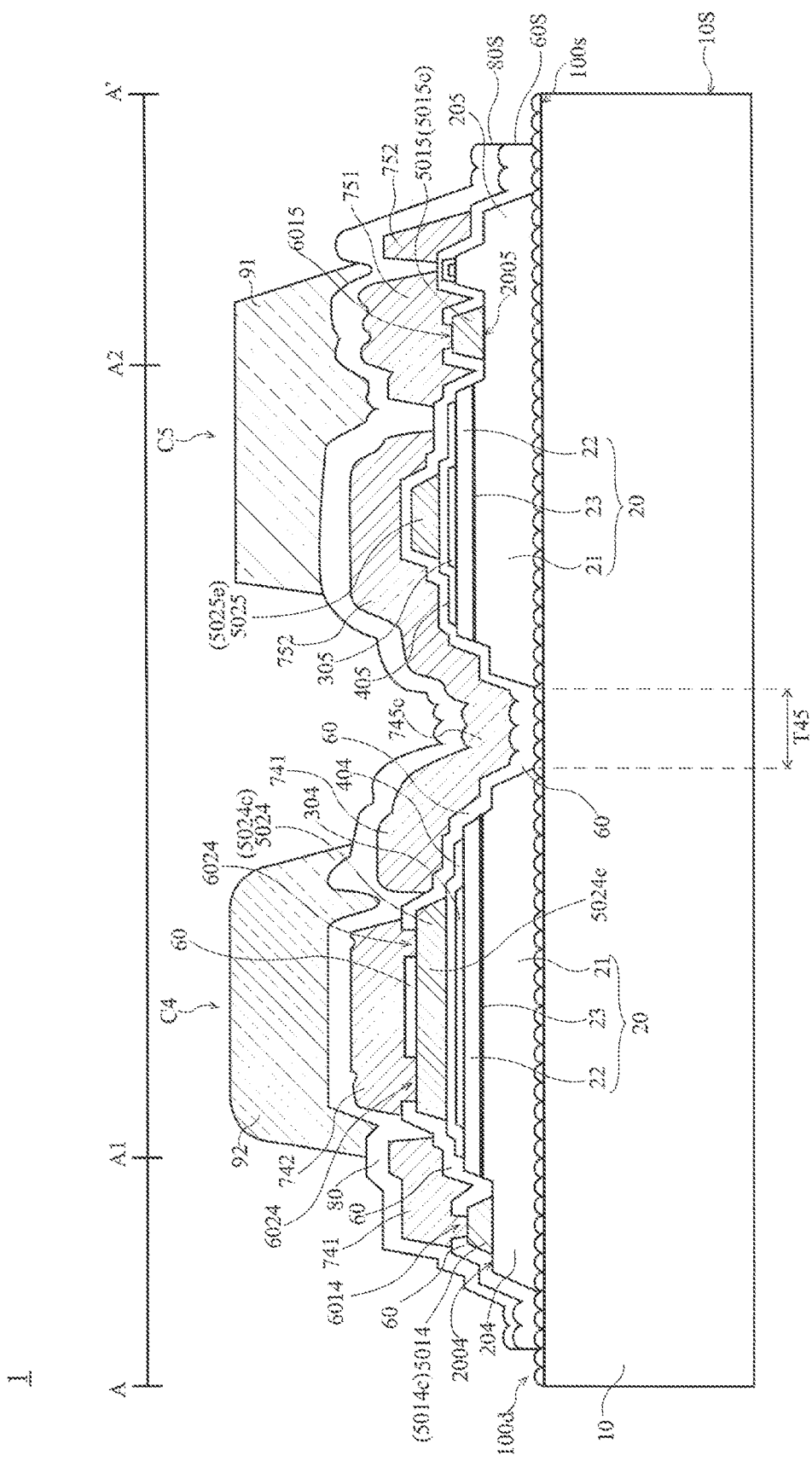
FIG. 3 illustrates a cross-sectional view taken along line A-A1-A2-A' of FIG. 1.

FIG. 1 illustrates a top view of a light-emitting device 1 in accordance with an embodiment of the present application. FIG. 2 illustrates top views of layers of the light-emitting device 1 of FIG. 1. FIG. 3 illustrates a cross-sectional view taken along line A-A1-A2-A' of FIG. 1.

The light-emitting device 1 includes a street 100d surrounding the light-emitting device 1. The light-emitting device 1 includes a substrate 10 including a top surface 100s and part of the top surface 100s is exposed on the street 100d. The light-emitting device 1 further includes a plurality of light-emitting elements formed on the top surface 100s of the substrate 10. The plurality of light-emitting elements includes a first light-emitting element C1, a second light-emitting element C2, a third light-emitting element C3, a fourth light-emitting element C4, a fifth light-emitting element C5, a sixth light-emitting element C6 and a seventh light-emitting element C7 formed on the top surface 100s of the substrate 10. Each of the plurality of light-emitting elements C1, C2, C3, C4, C5, C6 and C7 includes a semiconductor stack 20. The semiconductor stack 20 includes a first semiconductor layer 21, an active layer 23 and a second semiconductor layer 22. The plurality of light-emitting elements C1, C2, C3, C4, C5, C6 and C7 is separated from each other by a plurality of trenches. The plurality of trenches includes a first trench T12, a second trench T23, a third trench T34, a fourth trench T45, a fifth trench T56 and a sixth trench T67. The first trench T12 is formed between the first light-emitting element C1 and the second light-emitting element C2. The second trench T23 is formed between the second light-emitting element C2 and the third light-emitting element C3. The third trench T34 is formed between the third light-emitting element C3 and the fourth light-emitting element C4. The fourth trench T45 is formed between the fourth light-emitting element C4 and the fifth light-emitting element C5. The fifth trench T56 is formed between the fifth light-emitting element C5 and the sixth light-emitting element C6. The sixth trench T67 is formed between the sixth light-emitting element C6 and the seventh light-emitting element C7. The plurality of trenches T12, T23, T34, T45, T56 and T67 exposes the top surface 100s of the substrate 10.

The plurality of light-emitting elements may be arranged to form a matrix having a rectangular shape in the top view of the light-emitting device 1, for example, the plurality of light-emitting elements is arranged to form one column, or the plurality of light-emitting elements is arranged to form a plurality of columns. In the embodiment, the plurality of light-emitting elements includes a first plurality of light-emitting elements arranged in a first column and a second plurality of light-emitting elements arranged in a second column. The first plurality of light-emitting elements, such as the first light-emitting element C1, the second light-emitting element C2, the third light-emitting element C3 and the fourth light-emitting element C4, is arranged in the first column. The second plurality of light-emitting elements, such as the fifth light-emitting element C5, the sixth light-emitting element C6 and the seventh light-emitting element C7, is arranged in the second column. The light-emitting elements C1, C2, C3, C4, C5, C6 and C7 are arranged to form a rectangular array. The first plurality of light-emitting elements may include an amount different from that of the second plurality of light-emitting elements. In another embodiment, the first plurality of light-emitting elements may include an amount same as that of the second plurality of light-emitting elements.

The substrate 10 can be a growth substrate, including gallium arsenide (GaAs) wafer for growing aluminum gallium indium phosphide (AlGaInP), or sapphire (Al$_2$O$_3$) wafer, gallium nitride (GaN) wafer or silicon carbide (SiC) wafer for growing gallium nitride (GaN), indium gallium nitride (InGaN) or aluminum gallium nitride (AlGaN). In another embodiment, the substrate 10 can be a support substrate, the semiconductor stack 20 which was originally epitaxially grown on the growth substrate can be transferred to the support substrate, and the growth substrate originally used for epitaxial growth is optionally removed according to the requirements of the application.

The semiconductor stack 20 includes a buffer layer (not shown) formed between the first semiconductor layer 21 and the substrate 10 which can release the stress caused by lattice mismatch between the materials of the substrate 10 and the first semiconductor layer 21 so the lattice dislocation and the lattice defect are reduced and the epitaxial quality of the semiconductor stack 20 is improved. The buffer layer includes a single layer or a structure including a plurality of layers. In an embodiment, an aluminum nitride (AlN) layer formed by using PVD method can be the buffer layer formed between the first semiconductor layer 21 and the substrate 10 to improve the epitaxial quality of the semiconductor stack 20. In an embodiment, the method for forming the aluminum nitride (AlN) is PVD, and the target is made of aluminum nitride. In another embodiment, a target made of aluminum reacts with a nitrogen source to form the aluminum nitride.

The wavelength of the light emitted from the light-emitting device 1 is adjusted by changing the physical and chemical composition of one or more layers in the semiconductor stack 20. The material of the semiconductor stack 20 includes a group III-V semiconductor material, such as Al$_x$In$_y$Ga$_{(1-x-y)}$N or Al$_x$In$_y$Ga$_{(1-x-y)}$P, wherein 0≤x, y≤1; (x+y)≤1. According to the material of the active layer 23, when the material of the semiconductor stack 20 includes AlInGaP series material, red light having a wavelength between 610 nm and 650 nm or yellow light having a wavelength between 550 nm and 570 nm can be emitted.

When the material of the semiconductor stack 20 includes InGaN series material, blue or deep blue light having a wavelength between 400 nm and 490 nm or green light having a wavelength between 490 nm and 550 nm can be emitted. When the material of the semiconductor stack 20 includes AlGaN series material, UV light having a wavelength between 400 nm and 250 nm can be emitted.

The first semiconductor layer 21 and the second semiconductor layer 22 can be cladding layers, have different conductivity types, electrical properties, polarities, or doping elements for providing electrons or holes. For example, the first semiconductor layer 21 is an n-type semiconductor and the second semiconductor layer 22 is a p-type semiconductor. The active layer 23 is formed between the first semiconductor layer 21 and the second semiconductor layer 22. The electrons and holes combine in the active layer 23 under a current driving to convert electric energy into light energy and then light is emitted from the active layer 23. The active layer 23 can be a single heterostructure (SH), a double heterostructure (DH), a double-side double heterostructure (DDH), or a multi-quantum well structure (MQW). The material of the active layer 23 can be i-type, p-type, or n-type semiconductor. The first semiconductor layer 21, the active layer 23, or the second semiconductor layer 22 can be a single layer or a structure including a plurality of layers.

Referring to FIG. 1 and FIG. 2, selective etching is performed on the semiconductor stack 20 to remove portions of the active layer 23 and the second semiconductor layer 22 to form contact openings exposing the first semiconductor layer 21, mesas including the active layer 23 and the second semiconductor layer 22, and surrounding parts including the first semiconductor layer 21 and surrounding the mesas respectively. In the embodiment, a plurality of contact openings including a first contact opening 2001, a second contact opening 2002, a third contact opening 2003, a fourth contact opening 2004, a fifth contact opening 2005, a sixth contact opening 2006 and a seventh contact opening 2007 is formed to expose a portion of the first semiconductor layers 21. A plurality of surrounding parts including a first surrounding part 201s, a second surrounding part 202s, a third surrounding part 203s, a fourth surrounding part 204s, a fifth surrounding part 205s, a sixth surrounding part 206s and a seventh surrounding part 207s is formed to expose a portion of the first semiconductor layers 21. A plurality of mesas, including a first mesa 201, a second mesa 202, a third mesa 203, a fourth mesa 204, a fifth mesa 205, a sixth mesa 206 and a seventh mesa 207, is formed and respectively surrounded by the first surrounding part 201s, the second surrounding part 202s, the third surrounding part 203s, the fourth surrounding part 204s, the fifth surrounding part 205s, the sixth surrounding part 206s and the seventh surrounding part 207s. The contact openings 2001, 2002, 2003, 2004, 2005, 2006 and 2007 have a range of inclination angles, such as 10 to 75 degrees, with respect to the top surface 100s of the substrate 10 or a surface of the first semiconductor layer 21.

The first contact opening 2001, the second contact opening 2002, the third contact opening 2003, the fifth contact opening 2005, the sixth contact opening 2006 and the seventh contact opening 2007 are respectively surrounded by the second semiconductor layers 22 of the first mesa 201, the second mesa 202, the third mesa 203, the fifth mesa 205, the sixth mesa 206 and the seventh mesa 207. The fourth contact opening 2004 is formed at a periphery of the fourth light-emitting element C4.

In an embodiment, the light-emitting element, such as the fifth light-emitting element C5, the sixth light-emitting element C6 and the seventh light-emitting element C7 may further include an auxiliary contact opening formed adjacent to the surrounding part of the light-emitting element, wherein the auxiliary contact opening and the surrounding part are continuously connected. For example, as shown in FIG. 1 and FIG. 2, the fifth light-emitting element C5 includes a fifth auxiliary contact opening 2005' formed adjacent to the fifth surrounding part 205s, the sixth light-emitting element C6 includes a sixth auxiliary contact opening 2006' formed adjacent to the sixth surrounding part 206s and the seventh light-emitting element C7 includes a seventh auxiliary contact opening 2007' formed adjacent to the seventh surrounding part 207s.

As shown in FIG. 1 and FIG. 3, a plurality of current blocking layers, including a first current blocking layer 301, a second current blocking layer 302, a third current blocking layer 303, a fourth current blocking layer 304, a fifth current blocking layer 305, a sixth current blocking layer 306 and a seventh current blocking layer 307, is respectively formed on the second semiconductor layers 22 of the plurality of mesas 201, 202, 203, 204, 205, 206 and 207. The plurality of current blocking layers 301, 302, 303, 304, 305, 306 and 307 includes a non-conductive material including aluminum oxide ($Al_2O_3$), silicon nitride ($SiN_x$), silicon oxide ($SiO_x$), titanium oxide ($TiO_x$), or magnesium fluoride ($MgF_x$). In an embodiment, the plurality of current blocking layers 301, 302, 303, 304, 305, 306 and 307 includes two or more materials of different refractive indices alternately stacked to form a Distributed Bragg Reflector (DBR). In an embodiment, the Distributed Bragg Reflector (DBR) is laminated with sub-layers of $SiO_2$ and $TiO_2$, or $SiO_2$ and $Nb_2O_5$ to selectively reflect light of a specific wavelength, thereby increasing the light extraction efficiency of the light-emitting device 1. When the peak emission wavelength of the light-emitting device 1 is $\lambda$, the optical thickness of the Distributed Bragg Reflector (DBR) can an integral multiple of $\lambda/4$. The peak emission wavelength refers to the wavelength having a strongest intensity in the emission spectrum of the light-emitting device 1. The thickness of the Distributed Bragg Reflector (DBR) may have a deviation of ±30% on the basis of an integral multiple of the optical thickness $\lambda/4$.

As shown in FIG. 1 and FIG. 3, a plurality of conductive layers, including a first conductive layer 401, a second conductive layer 402, a third conductive layer 403, a fourth conductive layer 404, a fifth conductive layer 405, a sixth conductive layer 406 and a seventh conductive layer 407, is respectively formed on the second semiconductor layers 22 of the plurality of mesas 201, 202, 203, 204, 205, 206 and 207 and/or the plurality of current blocking layers 301, 302, 303, 304, 305, 306 and 307. Each of the plurality of conductive layers 401, 402, 403, 404, 405, 406 and 407 occupies an area larger than 70%, preferably larger than 80%, and more preferably larger than 90% of an entire area of the second semiconductor layer 22 of the mesa which each conductive layer is formed on. The plurality of current blocking layers 301, 302, 303, 304, 305, 306 and 307 is formed between the second semiconductor layers 22 and the plurality of conductive layers 401, 402, 403, 404, 405, 406 and 407. The material of the plurality of conductive layers 401, 402, 403, 404, 405, 406 and 407 includes a light-transmitting conductive oxide or a light-transmitting metal. The light-transmitting conductive oxide includes indium tin oxide (ITO), zinc oxide (ZnO), zinc indium tin oxide (ZITO), zinc indium oxide (ZIO), zinc tin oxide (ZTO), gallium indium tin oxide (GITO), gallium indium oxide (GIO) or gallium zinc oxide (GZO). The light-transmitting conductive oxide includes various dopants such as aluminum doped zinc oxide (AZO) or fluorine doped tin oxide (FTO). The light-transmitting metal includes nickel (Ni) or gold (Au).

As shown in FIG. 2 and FIG. 3, a plurality of lower electrodes, including a first lower electrode 5011, a second lower electrode 5012, a third lower electrode 5013, a fourth lower electrode 5014, a fifth lower electrode 5015, a sixth lower electrode 5016, a seventh lower electrode 5017, is respectively formed on the first semiconductor layers 21 of the first contact opening 2001, the second contact opening 2002, the third contact opening 2003, the fourth contact opening 2004, the fifth contact opening 2005, the sixth contact opening 2006 and the seventh contact opening 2007 of the plurality of light-emitting elements C1, C2, C3, C4, C5, C6 and C7. In the embodiment, the plurality of lower electrodes further includes a fifth auxiliary lower electrode 5015', a sixth auxiliary lower electrode 5016' and a seventh auxiliary lower electrode 5017' respectively formed on the first semiconductor layers 21 of the fifth auxiliary contact opening 2005', the sixth auxiliary contact opening 2006' and the seventh auxiliary contact opening 2007'. A plurality of upper electrodes, including a first upper electrode 5021, a second upper electrode 5022, a third upper electrode 5023, a fourth upper electrode 5024, a fifth upper electrode 5025, a sixth upper electrode 5026, a seventh upper electrode 5027, is respectively formed on the second semiconductor layers 22 or the plurality of conductive layers 401, 402, 403, 404, 405, 406 and 407 of the plurality of light-emitting elements C1, C2, C3, C4, C5, C6 and C7. The plurality of lower electrodes 5011, 5012, 5013, 5014, 5015, 5016, 5017, the auxiliary lower electrodes 5015', 5016', 5017', and/or the plurality of upper electrodes 5021, 5022, 5023, 5024, 5025, 5026, 5027 includes a metal material including chromium (Cr), titanium (Ti), tungsten (W), gold (Au), aluminum (Al), indium (In), tin (Sn), nickel (Ni), platinum (Pt) or an alloy of the above materials. In one embodiment, each of the plurality of current blocking layers 301, 302, 303, 304, 305, 306 and 307 includes a shape respectively corresponding to that of the plurality of upper electrodes 5021, 5022, 5023, 5024, 5025, 5026, and 5027. In another embodiment, each of the plurality of current blocking layers 301, 302, 303, 304, 305, 306 and 307 includes a shape different from that of the plurality of upper electrodes 5021, 5022, 5023, 5024, 5025, 5026, and 5027. In particular, the shape of an enlarged portion of the current blocking layer is different from that of an enlarged portion of the upper electrode formed thereon. Each of the plurality of current blocking layers 301, 302, 303, 304, 305, 306 and 307 is respectively formed under the plurality of upper electrodes 5021, 5022, 5023, 5024, 5025, 5026, 5027.

In each of the plurality of light-emitting elements C1 to C7, an amount of the plurality of lower electrodes is smaller than that of the plurality of upper electrodes. In the plurality of light-emitting elements C1, C2, C3, C5, C6 and C7, the lower electrode is disposed between two upper electrodes. In an embodiment, one of the light-emitting elements, such as the fourth light-emitting element C4, includes same amount of the lower electrode and the upper electrode.

The lower electrodes and the upper electrodes of the light-emitting elements C1, C2 and C3 respectively include same electrode layout. The lower electrode and the upper electrode of the light-emitting elements C5, C6 and C7 respectively include same electrode layout. The electrode layouts of the lower electrode and the upper electrode of the light-emitting element C4 are respectively different from that of the plurality of light-emitting elements C1, C2 and C3, and that of the plurality of light-emitting elements C5, C6 and C7.

As shown in FIG. 2 and FIG. 3, an insulating layer 60 is formed on the substrate 10, portions of the first semiconductor layer 21 of the plurality of contact openings 2001, 2002, 2003, 2004, 2005, 2006 and 2007, the auxiliary contact opening 2005', 2006' and 2007', and the plurality of mesas 201, 202, 203, 204, 205, 206 and 207. The insulating layer 60 includes a plurality of lower openings including one or more first lower opening 6011, one or more second lower opening 6012, one or more third lower opening 6013, one or more fourth lower opening 6014, one or more fifth lower opening 6015, one or more sixth lower opening 6016 and one or more seventh lower opening 6017 respectively formed on the plurality of contact openings 2001, 2002, 2003, 2004, 2005, 2006 and 2007. In the fifth light-emitting element C5, the sixth light-emitting element C6 and the seventh light-emitting element C7, the fifth lower opening 6015, the sixth lower opening 6016 and the seventh lower opening 6017 are respectively formed on the fifth auxiliary contact opening 2005', the sixth auxiliary contact opening 2006' and the seventh auxiliary contact opening 2007'. The insulating layer 60 further includes a plurality of upper openings including a first upper opening 6021, a second upper opening 6022, a third upper opening 6023, a fourth upper opening 6024, a fifth upper opening 6025, a sixth upper opening 6026 and a seventh upper opening 6027 formed on the plurality of mesas 201, 202, 203, 204, 205, 206 and 207. The plurality of lower electrodes 5011, 5012, 5013, 5014, 5015, 5016, 5017 is exposed by the plurality of lower openings 6011, 6012, 6013, 6014, 6015, 6016 and 6017. In the fifth light-emitting element C5, the sixth light-emitting element C6 and the seventh light-emitting element C7, the fifth auxiliary lower electrode 5015', the sixth auxiliary lower electrode 5016' and the seventh auxiliary lower electrode 5017' are respectively exposed by the fifth lower opening 6015, the sixth lower opening 6016 and the seventh lower opening 6017. The plurality of second electrodes 5021, 5022, 5023, 5024, 5025, 5026, 5027 is exposed by the plurality of upper openings 6021, 6022, 6023, 6024, 6025, 6026 and 6027.

As shown in FIG. 1, FIG. 2 and FIG. 3, the light-emitting device 1 includes a plurality of fan electrodes including a first fan electrode 71, a second fan electrode 72, a third fan electrode 73, a fourth fan electrode 74, a fifth fan electrode 75, a sixth fan electrode 76 and a seventh fan electrode 77.

The first fan electrode 71 includes a first bottom electrode portion 711 and a first top electrode portion 712. The second fan electrode 72 includes a second bottom electrode portion 721 and a second top electrode portion 722. The third fan electrode 73 includes a third bottom electrode portion 731 and a third top electrode portion 732. The fourth fan electrode 74 includes a fourth bottom electrode portion 741 and a fourth top electrode portion 742. The fifth fan electrode 75 includes a fifth bottom electrode portion 751 and a fifth top electrode portion 752. The sixth fan electrode 76 includes a sixth bottom electrode portion 761 and a sixth top electrode portion 762. The seventh fan electrode 77 includes a seventh bottom electrode portion 771 and a seventh top electrode portion 772.

The first bottom electrode portion 711, the second bottom electrode portion 721, the third bottom electrode portion 731, the fourth bottom electrode portion 741, the fifth bottom electrode portion 751, the sixth bottom electrode portion 761 and the seventh bottom electrode portion 771 are correspondingly formed on the plurality of light-emitting elements C1, C2, C3, C4, C5, C6 and C7, and contacting the plurality of lower electrodes 5011, 5012, 5013, 5014, 5015, 5016, 5017 through the plurality of lower openings of the insulating layer 6011, 6012, 6013, 6014, 6015, 6016 and 6017. In the fifth light-emitting element C5, the sixth light-emitting element C6 and the seventh light-emitting element C7, the fifth bottom electrode portion 751, the sixth bottom electrode portion 761 and the seventh bottom electrode portion 771 are correspondingly formed on the light-emitting elements C5, C6 and C7, contacting the fifth auxiliary lower electrode 5015', the sixth auxiliary lower electrode 5016' and the seventh auxiliary lower electrode 5017' through the plurality of lower openings of the insulating layer 6015, 6016 and 6017.

The first top electrode portion 712, the second top electrode portion 722, the third top electrode portion 732, the fourth top electrode portion 742, the fifth top electrode portion 752, the sixth top electrode portion 762 and the seventh top electrode portion 772 are correspondingly formed on the plurality of light-emitting elements C1, C2, C3, C4, C5, C6 and C7, contacting the plurality of upper electrodes 5021, 5022, 5023, 5024, 5025, 5026, 5027 through the plurality of upper openings of the insulating layer 6021, 6022, 6023, 6024, 6025, 6026 and 6027.

A ratio of the surface area of the top electrode portion to that of the bottom electrode portion which are on one light-emitting element is between 1.1~1.6, preferably between 1.2~1.5, and more preferably between 1.25~1.45. The bottom electrode portion is separated from the top electrode portion by a shortest distance smaller than 100 μm, preferably smaller than 80 μm, and preferably smaller than 70 μm. The shortest distance is larger than 10 μm, preferably larger than 20 μm, and preferably larger than 30 μm.

In an embodiment, the bottom electrode portion or the top electrode portion includes a base portion and one or a plurality branches extending from the base portion. In the top view of the light-emitting device 1, the bottom electrode portion or the top electrode portion includes a comb shape.

In another embodiment, the bottom electrode portion or the top electrode portion includes one or a plurality of extensions, wherein the plurality of extensions are separated from each other without connection. In the top view of the light-emitting device 1, the bottom electrode portion or the top electrode portion includes a linear or a curve shape.

In the plurality of light-emitting elements C1, C2, C3, C5, C6 and C7, the bottom electrode portion includes a bottom branch disposed between two top branches of the top electrode portion. An amount of the top branches of the top electrode portion is larger than that of the bottom branches of bottom electrode portion. In an embodiment, the bottom branch includes a width larger or smaller than that of the top branch. In another embodiment, the width of the bottom branch is same as that of the top branch. As shown in FIG. 1 and FIG. 2, the first bottom electrode portion 711, the second bottom electrode portion 721, the third bottom electrode portion 731, the fifth bottom electrode portion 751, the sixth bottom electrode portion 761 and the seventh bottom electrode portion 771 each includes a comb shape. The first top electrode portion 712, the second top electrode portion 722, the third top electrode portion 732, the fifth top electrode portion 752, the sixth top electrode portion 762 and the seventh top electrode portion 772 each includes a comb shape.

The light-emitting device 1 further includes a plurality of connecting electrode portions 712c, 723c, 734c, 745c, 756c and 767c correspondingly formed on the plurality of trenches T12, T23, T34, T45, T56 and T67. The first connecting electrode portion 712c connects the first bottom electrode portion 711 on the first light-emitting element C1 and the second top electrode portion 722 on the second light-emitting element C2. The second connecting electrode portion 723c connects the second bottom electrode portion 721 on the second light-emitting element C2 and the third top electrode portion 732 on the third light-emitting element C3. The third connecting electrode portion 734c connects the third bottom electrode portion 731 on the first light-emitting element C3 and the fourth top electrode portion 742 on the second light-emitting element C4. The fourth connecting electrode portion 745c connects the fourth bottom electrode portion 741 on the fourth light-emitting element C4 and the fifth top electrode portion 752 on the fifth light-emitting element C5. The fifth connecting electrode portion 756c connects the fifth bottom electrode portion 751 on the fifth light-emitting element C5 and the sixth top electrode portion 762 on the sixth light-emitting element C6. The sixth connecting electrode portion 767c connects the sixth bottom electrode portion 761 on the sixth light-emitting element C6 and the seventh top electrode portion 772 on the seventh light-emitting element C7.

The plurality of bottom electrode portions 711, 721, 731, 741, 751, 761 and 771, the plurality of top electrode portions 712, 722, 732, 742, 752, 762 and 772, and the plurality of connecting electrode portions 712c, 723c, 734c, 745c, 756c and 767c include a metal material including chromium (Cr), titanium (Ti), tungsten (W), gold (Au), aluminum (Al), indium (In), tin (Sn), nickel (Ni), platinum (Pt) or an alloy of the above materials. In an embodiment, the plurality of bottom electrode portions 711 to 771, the plurality of top electrode portions 712 to 772, and the plurality of connecting electrode portions 712c, 723c, 734c, 745c, 756c and 767c include same or different metal material.

As shown in FIG. 1, FIG. 2 and FIG. 3, the light-emitting device 1 further includes a passivation layer 80 formed on the substrate 10, covering a portion of the first semiconductor layers 21 of the plurality of contact openings 2001, 2002, 2003, 2004, 2005, 2006 and 2007, the auxiliary contact openings 2005', 2006' and 2007', and covers the plurality of mesas 201, 202, 203, 204, 205, 206 and 207. The passivation layer 80 includes one or a plurality of first passivation openings 801 exposing the seventh bottom electrode portion 771 on the seventh light-emitting element C7. The passivation layer 80 includes one or a plurality of second passivation openings 802 exposing the first top electrode portion 712 on the first light-emitting element C1.

In an embodiment, the insulating layer 60 and/or the passivation layer 80 includes two or more materials of different refractive indices alternately stacked to form a Distributed Bragg Reflector (DBR). In an embodiment, the insulating layer 60 or the passivation layer 80 is laminated with sub-layers of $SiO_2$ and $TiO_2$, or $SiO_2$ and $Nb_2O_5$ to selectively reflect light of a specific wavelength, thereby increasing the light extraction efficiency of the light-emitting device 1. When the peak emission wavelength of the light-emitting device 1 is λ, the optical thickness of the insulating layer 60 or the passivation layer 80 can be an integral multiple of λ/4. The peak emission wavelength refers to the wavelength having a strongest intensity in the emission spectrum of the light-emitting device 1. The thickness of the insulating layer 60 or the passivation layer 80 may have a deviation of ±30% on the basis of an integral multiple of the optical thickness λ/4.

The insulating layer 60 and/or the passivation layer 80 includes a non-conductive material including organic material, inorganic material or dielectric material. The organic material includes Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, or fluorocarbon polymer. The inorganic material includes silicone or glass. The dielectric material includes aluminum oxide ($Al_2O_3$), silicon nitride ($SiN_x$), silicon oxide ($SiO_x$), titanium oxide ($TiO_x$), or magnesium fluoride ($MgF_x$).

In an embodiment of the present application, the insulating layer 60 or the passivation layer 80 includes a thickness between 1000 angstrom (Å) and 40,000 angstrom (Å).

In an embodiment of the present application, the material of the insulating layer 60 or the passivation layer 80 includes $SiO_2$, $TiO_2$, or $SiN_x$. If the thickness of the insulating layer 60 or the passivation layer 80 is less than 1000 angstrom (Å), the thinner thickness may make the insulating property of the insulating layer 60 or the passivation layer 80 weak. In an embodiment of the present application, the material of the insulating layer 60 or the passivation layer 80 includes $SiO_2$, $TiO_2$ or $SiN_x$. If the thickness of the insulating layer 60 or the passivation layer 80 is thicker than 40,000 angstrom (Å), it is getting difficult to perform selective etching on the insulating layer 60 or the passivation layer 80. However, the above embodiments do not exclude other materials having a good covering extensibility or a high etch selectivity to avoid the problem caused by the thin thickness or the thick thickness of insulating layer 60 or the passivation layer 80.

The light-emitting device 1 further includes a first electrode pad 91 formed on the second plurality of light-emitting elements and a second electrode pad 92 formed on the first plurality of light-emitting elements. In an embodiment, an amount of the second plurality of light-emitting elements covered by the first electrode pad 91 is same as that of the first plurality of light-emitting elements covered by the second electrode pad 92. In another embodiment, an amount of the second plurality of light-emitting elements covered by the first electrode pad 91 is different from that of the first plurality of light-emitting elements covered by the second electrode pad 92.

As shown in FIG. 1, FIG. 2 and FIG. 3, the first electrode pad 91 is formed on the second plurality of light-emitting elements, such as the fifth light-emitting element C5, the sixth light-emitting element C6 and the seventh light-emitting element C7. The first electrode pad 91 contacts the seventh bottom electrode portion 771 on the seventh light-emitting element C7 through the one or the plurality of first passivation openings 801 of the passivation layer 80.

A second electrode pad 92 is formed on the first plurality of light-emitting elements, such as the first light-emitting element C1, the second light-emitting element C2, the third light-emitting element C3 and the fourth light-emitting element C4. The second electrode pad 92 contacts the first top electrode portion 712 on the first light-emitting element C1 through the one or the plurality of second passivation openings 802 of the passivation layer 80.

An array structure in which the seven light-emitting elements C1 to C7 are electrically connected in series, and the electrical connection thereof to the outside is achieved through the first electrode pad 91 and the second electrode pad 92. In detailed, the light-emitting elements C1, C2, C3, C4, C5, C6 and C7 are electrically connected in series by the bottom electrode portions 711, 721, 731, 741, 751, 761 and 771, the top electrode portions 712, 722, 732, 742, 752, 762 and 772, and the connecting electrode portions 712c, 723c, 734c, 745c, 756c and 767c. However, the seven light-emitting elements C1 to C7 in this embodiment are merely an example, and various numbers of light-emitting elements may be formed.

The first electrode pad 91 and the second electrode pad 92 include a metal material including chromium (Cr), titanium (Ti), tungsten (W), gold (Au), aluminum (Al), indium (In), tin (Sn), nickel (Ni), platinum (Pt) or an alloy of the above materials.

Figure 4:
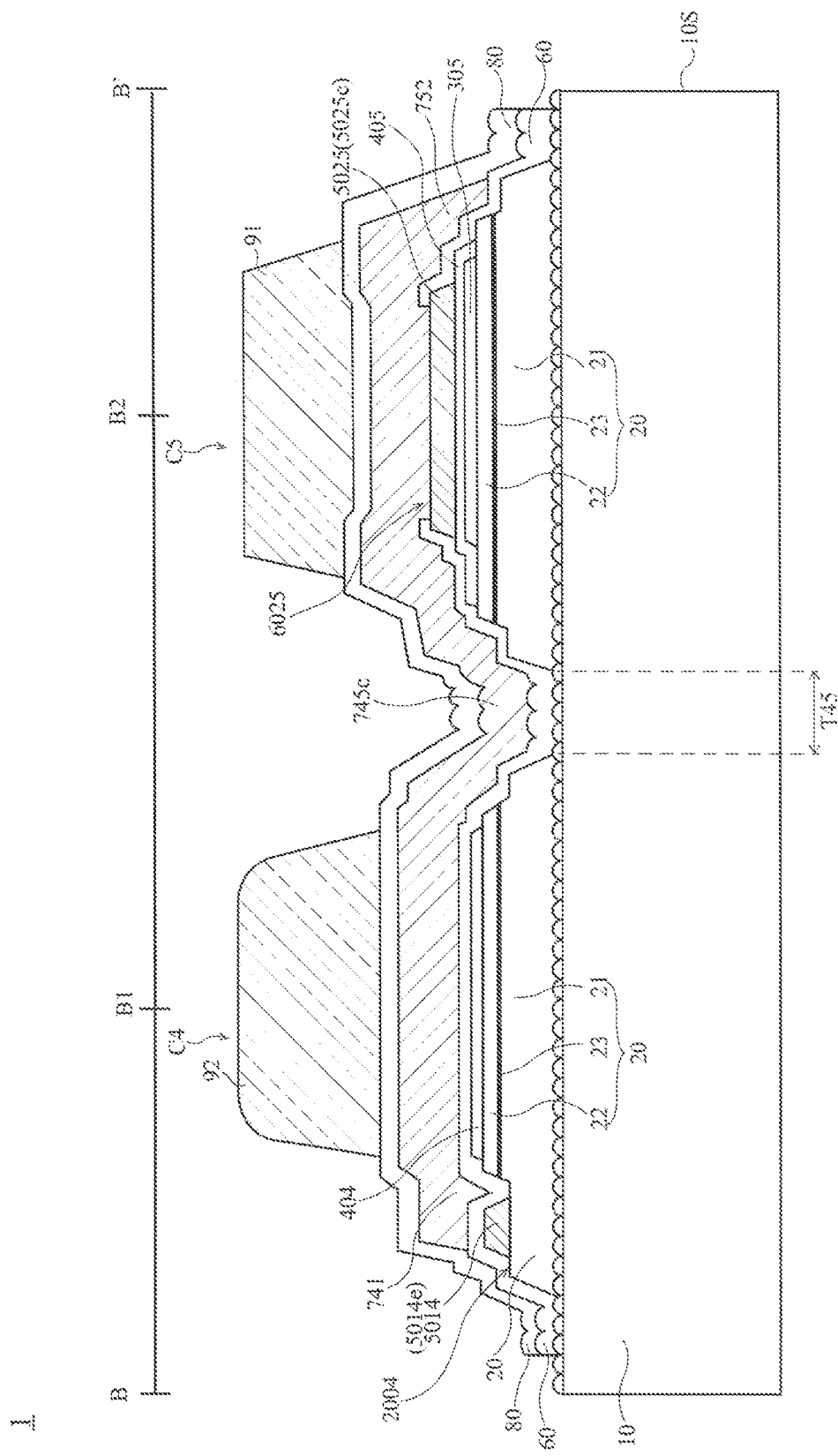
FIG. 4 illustrates a cross-sectional view taken along line B-B1-B2-B' of FIG. 1.

As shown in FIG. 1, FIG. 3 and FIG. 4, FIG. 1 illustrates the top view of the light-emitting device 1, FIG. 3 illustrates the cross-sectional view taken along line A-A1-A2-A' of FIG. 1, and FIG. 4 illustrates the cross-sectional view taken along line B-B1-B2-B' of FIG. 1. As shown in FIG. 3, the light-emitting device 1 includes the substrate 10; the fourth light-emitting element C4 and the fifth light-emitting element C5 formed on the substrate 10. The fourth trench T45 is formed between the fourth light-emitting element C4 and the fifth light-emitting element C5. The fourth current blocking layer 304 is formed on the second semiconductor layer 22 of the fourth mesa 204 of the fourth light-emitting element C4. The fifth current blocking layer 305 is formed on the second semiconductor layer 22 of the fifth mesa 205 of the fifth light-emitting element C5. The fourth conductive layer 404 and the fifth conductive layer 405 are respectively formed on the fourth current blocking layer 304 and the fifth current blocking layer 305. The fourth lower electrode 5014 is formed on the exposed first semiconductor layer 21, and the fourth upper electrode 5024 is formed on the fourth conductive layer 404 of the fourth light-emitting element C4. The fifth lower electrode 5015 is formed on the exposed first semiconductor layer 21 surrounded by the second semiconductor layer 22, and the fifth upper electrode 5025 is formed on the fifth conductive layer 405 of the fifth light-emitting element C5.

As shown in FIG. 1, the fourth lower electrode 5014 on the fourth light-emitting element C4 includes one or a plurality of fourth lower contact areas 5014c, and two of the fourth lower contact areas 5014c are connected to each other by a fourth lower extension part 5014e. The fourth upper electrode 5024 on the fourth light-emitting element C4 includes one or a plurality of fourth upper contact areas 5024c, and two of the fourth upper contact areas 5024c are connected to each other by a fourth upper extension part 5024e. An amount of the plurality of fourth upper contact areas 5024c is larger than that of the plurality of fourth lower contact areas 5014c.

The fourth lower electrode 5014 is entirely covered by the fourth bottom electrode portion 741 and the fourth upper electrode 5024 is entirely covered by the fourth top electrode portion 742. The fourth lower electrode 5014 is entirely not covered by the second electrode pad 92, and the fourth upper electrode 5024 is partially covered by the second electrode pad 92.

In the top view of the light-emitting device 1, the fourth bottom electrode portion 741 includes a surface area projected onto the fourth light-emitting element C4 which is smaller than that of the fourth top electrode portion 742 projected onto the fourth light-emitting element C4. A ratio of the surface area of the fourth top electrode portion 742 to that of the fourth bottom electrode portion 741 on the fourth light-emitting element C4 is between 1.1~1.6, preferably between 1.2~1.5, and more preferably between 1.25~1.45. The fourth bottom electrode portion 741 is separated from the fourth top electrode portion 742 by a shortest distance smaller than 100 μm, preferably smaller than 80 μm, and more preferably smaller than 70 μm. The shortest distance is larger than 10 µm, preferably larger than 20 µm, and more preferably larger than 30 µm.

The fourth lower contact areas 5014c are not entirely covered by the insulating layer 60 and the fourth lower extension part 5014e is entirely covered by the insulating layer 60. The insulating layer 60 contacts a portion of the top surface 100s of the substrate 10. As shown in FIG. 3 and FIG. 4, the insulating layer 60 includes a first most outside edge 60S separated from an edge 10S of the substrate 10 by a distance between 5 µm~60 µm, preferably 10 µm~50 µm, and more preferably 20 µm~40 µm.

The fifth lower electrode 5015 on the fifth light-emitting element C5 includes one or a plurality of fifth lower contact areas 5015c. The fifth lower electrode 5015 includes one or more fifth lower extension part 5015e extended from opposite ends of the fifth lower contact area 5015c. The fifth upper electrode 5025 on the fifth light-emitting element C5 includes one or a plurality of fifth upper contact areas 5025c, and two of the fifth upper contact areas 5025c are connected to each other by a fifth upper extension part 5025e. In an embodiment, the fifth upper electrode 5025 includes one or more fifth upper extension part 5025e' extending from the fifth upper contact area 5025c. An amount of the plurality of fifth upper contact areas 5025c is larger than that of the plurality of fifth lower contact areas 5015c.

The fifth lower electrode 5015 is entirely covered by the fifth bottom electrode portion 751 and the fifth upper electrode 5025 is entirely covered by the fifth top electrode portion 752. The fifth lower electrode 5015 and the fifth upper electrode 5025 are covered by the first electrode pad 91. Portions of the fifth bottom electrode portion 751 and the fifth top electrode portion 752 are partially covered by the first electrode pad 91.

In the top view of the light-emitting device 1, the fifth bottom electrode portion 751 includes a surface area projected onto the fifth light-emitting element C5 which is smaller than that of the fifth top electrode portion 752 projected onto the fifth light-emitting element C5. A ratio of the surface area of the fifth top electrode portion 752 to that of the fifth bottom electrode portion 751 is between 1.1~1.6, preferably between 1.2~1.5, and more preferably between 1.25~1.45. The fifth bottom electrode portion 751 is separated from the fifth top electrode portion 752 by a shortest distance smaller than 100 µm, preferably smaller than 80 µm, and more preferably smaller than 70 µm. The shortest distance is larger than 10 µm, preferably larger than 20 µm, and more preferably larger than 30 µm.

The fourth lower contact areas 5014c and the fifth lower contact areas 5015c are not entirely covered by the insulating layer 60, and the fourth lower extension part 5014e and the fifth upper extension part 5025e are entirely covered by the insulating layer 60. The insulating layer 60 contacts a portion of the top surface 100s of the substrate 10.

In an embodiment of the present application, as shown in FIG. 3 and FIG. 4, the passivation layer 80 includes a second most outside edge 80S aligning the first most outside edge 60S of the insulating layer 60.

In another embodiment of the present application, the passivation layer 80 covers the first most outside edge 60S of the insulating layer 60. The second most outside edge 80S of the passivation layer 80 is separated from an edge 10S of the substrate 10.

Figure 5:
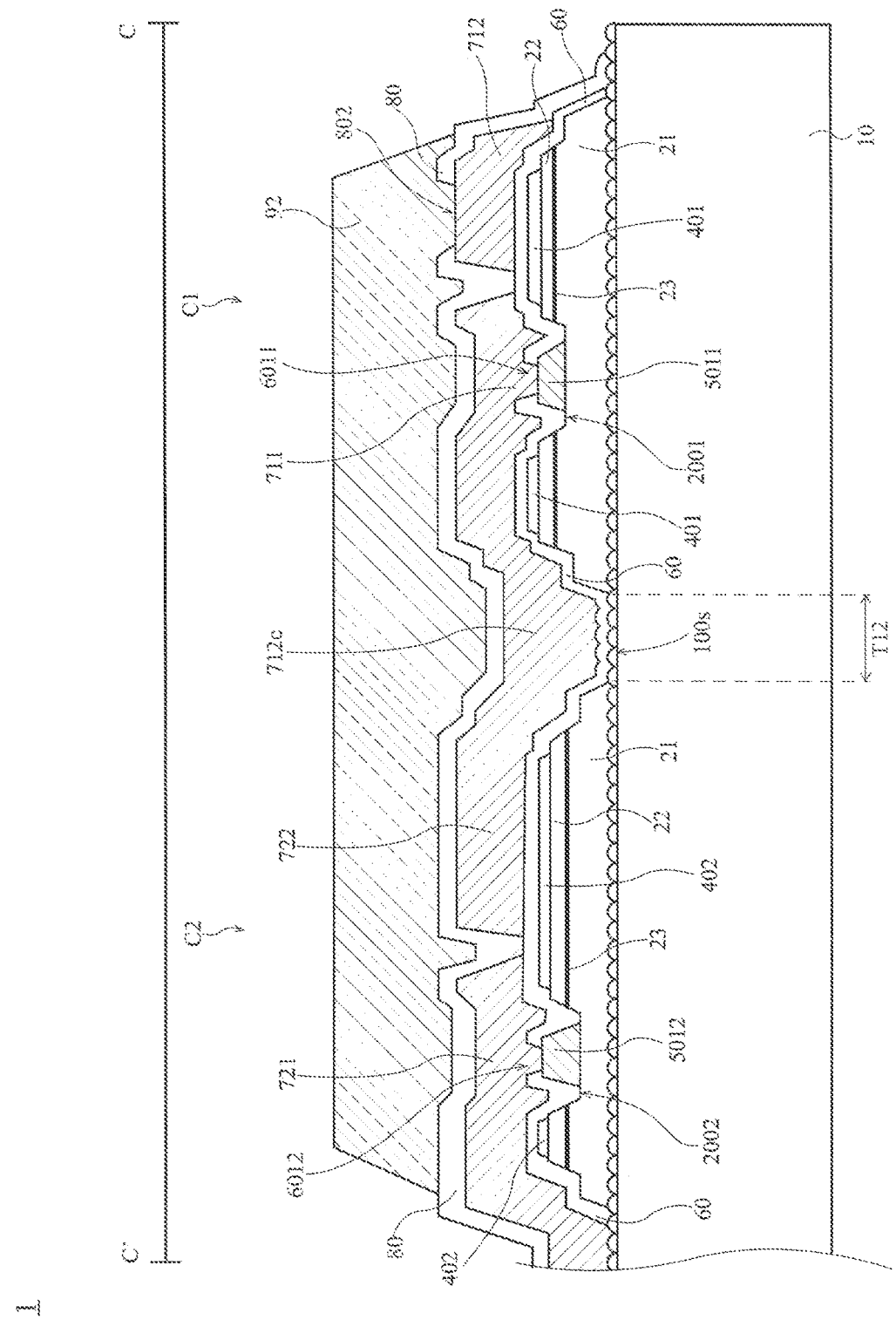
FIG. 5 illustrates a cross-sectional view taken along line C-C' of FIG. 1.

FIG. 5 illustrates the cross-sectional view taken along line C-C' of FIG. 1. As shown in FIG. 5, the light-emitting device 1 includes the first light-emitting element C1 and the second light-emitting element C2 formed on the substrate 10. The first light-emitting element C1 and the second light-emitting element C2 are separated by the first trench T12. The second light-emitting element C2 includes same electrode layout as that of the first light-emitting element C1, and the related description about the second light-emitting element C2 is properly skipped.

The first lower electrode 5011 on the first light-emitting element C1 includes one or a plurality of first lower contact areas 5011c, and the first lower contact areas 5011c are separated from each other. The first upper electrode 5021 on the first light-emitting element C1 includes one or a plurality of first upper contact areas 5021c, and the first upper contact areas 5021c are separated from each other. An amount of the first upper contact areas 5021c is larger than that of the first lower contact areas 5011c. The first upper electrode 5021 further includes one or more first upper extension parts 5021e connected to the first upper contact area 5021c. The first lower contact areas 5011c and the first upper contact areas 5021c are not entirely covered by the insulating layer 60. The first upper extension parts 5021e are entirely covered by the insulating layer 60.

The first lower electrode 5011 is entirely covered by the first bottom electrode portion 711 and the first upper electrode 5021 is entirely covered by the first top electrode portion 712. The first lower electrode 5011 and the first upper electrode 5021 are partially covered by the second electrode pad 92. Portions of the first lower electrode 5011, the first upper electrode 5021, the first bottom electrode portion 711 and the first top electrode portion 712 are not covered by the second electrode pad 92.

In the top view of the light-emitting device 1, the first bottom electrode portion 711 includes a surface area projected onto the first light-emitting element C1 which is smaller than that of the first top electrode portion 712 projected onto the first light-emitting element C1. A ratio of the surface area of the first top electrode portion 712 to that of the first bottom electrode portion 711 is between 1.1~1.6, preferably between 1.2~1.5, and more preferably between 1.25~1.45. The first bottom electrode portion 711 is separated from the first top electrode portion 712 by a shortest distance smaller than 100 µm, preferably smaller than 80 µm, and more preferably smaller than 70 µm. The shortest distance is larger than 10 µm, preferably larger than 20 µm, and more preferably larger than 30 µm.

As shown in FIG. 5, the first connecting electrode portion 712c is formed on the first trench T12 to connect the first bottom electrode portion 711 on the first light-emitting element C1 and the second top electrode portion 722 on the second light-emitting element C2.

Figure 6:
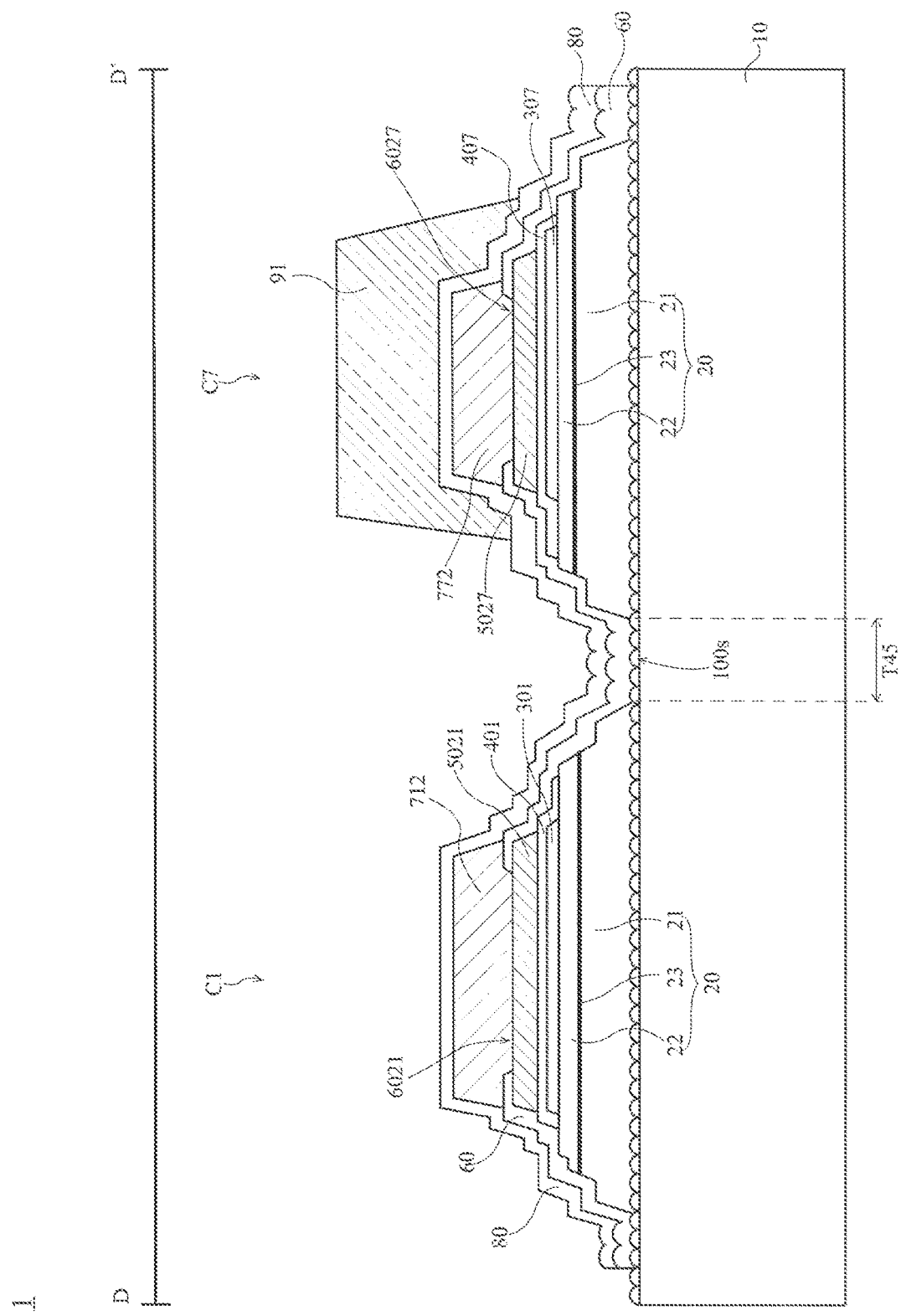
FIG. 6 illustrates a cross-sectional view taken along line D-D' of FIG. 1.

FIG. 6 illustrates the cross-sectional view taken along line D-D' of FIG. 1. The light-emitting device 1 includes the first light-emitting element C1 and the seventh light-emitting element C7 formed on the substrate 10. The first light-emitting element C1 and the seventh light-emitting element C7 are separated by the first trench T45. The seventh light-emitting element C7 includes same electrode layout as that of the fifth light-emitting element C5, and the related description about the seventh light-emitting element C7 is properly skipped.

Figure 7:
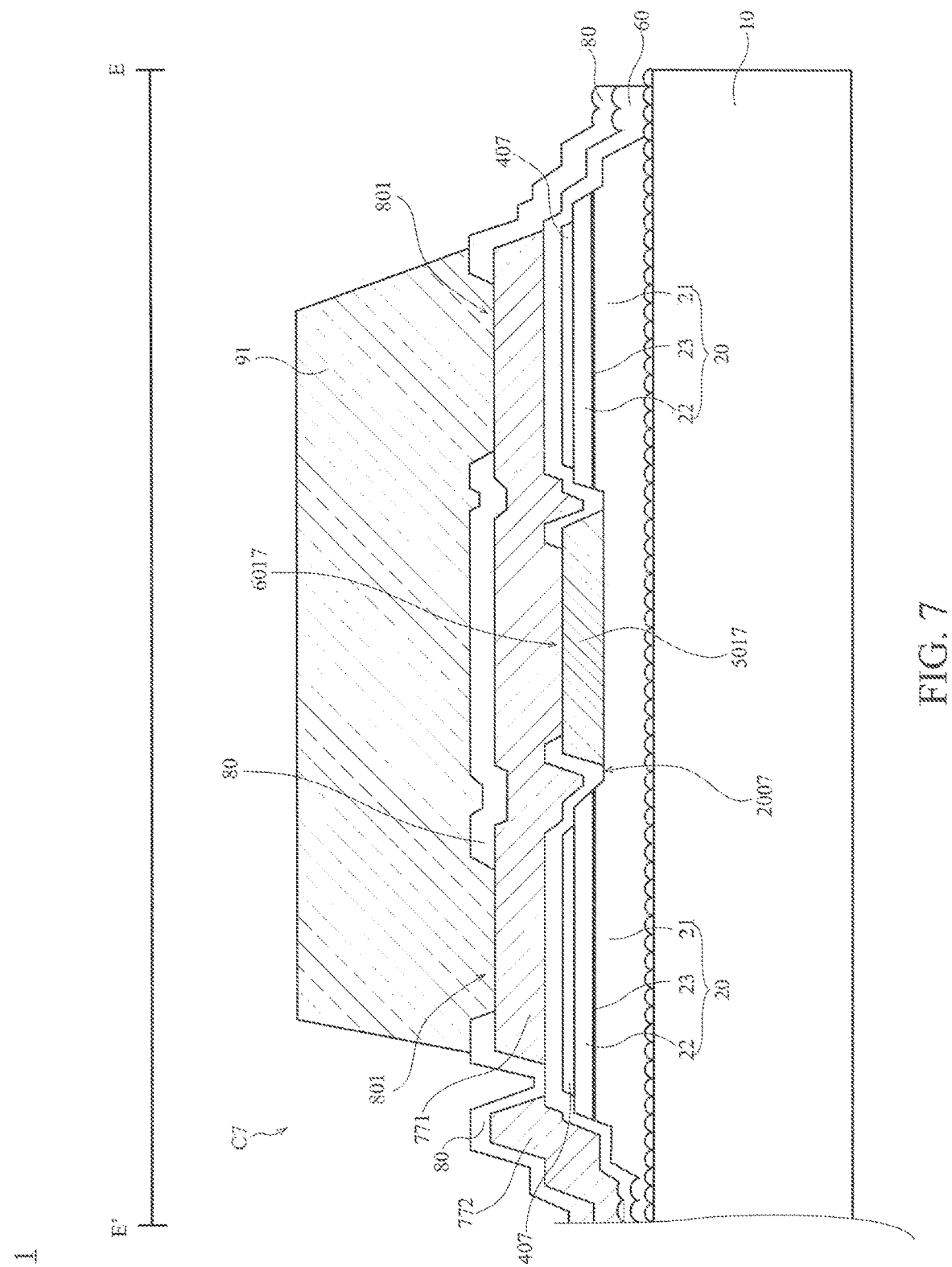
FIG. 7 illustrates a cross-sectional view taken along line E-E' of FIG. 1.

FIG. 7 illustrates the cross-sectional view taken along line E-E' of FIG. 1. The light-emitting device 1 includes the plurality of light-emitting elements, for example C1 to C7, and the plurality of light-emitting elements is electrically connected in series. The passivation layer 80 includes one or the plurality of first passivation openings 801 exposing the bottom electrode of the last one light-emitting element in the series connecting light-emitting elements, such as the seventh bottom electrode portion 771 on the seventh light-emitting element C7. As shown in FIG. 1 and FIG. 7, the plurality of first passivation openings 801 is disposed on two sides of the seventh lower electrode 5017 and/or between the seventh upper electrode 5027 to expose the seventh bottom electrode portion 771. The first electrode pad 91 is electrically connected to the first semiconductor layer 21 of the seventh light-emitting element C7 through the one or the plurality of first passivation openings 801 to contact the seventh bottom electrode portion 771.

Figure 8:
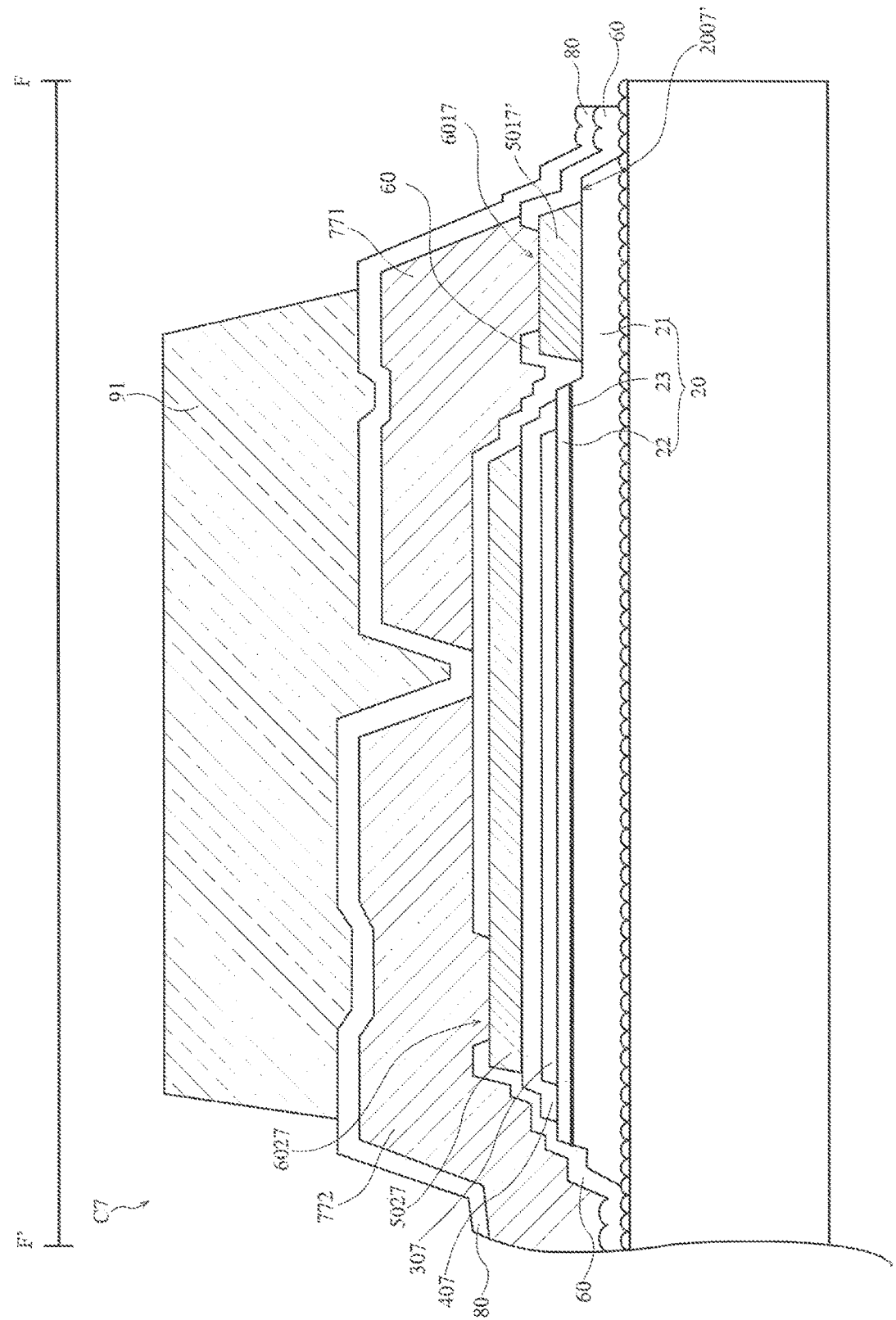
FIG. 8 illustrates a cross-sectional view taken along line F-F' of FIG. 1.

FIG. 8 illustrates the cross-sectional view taken along line F-F' of FIG. 1. The light-emitting element C7 includes a seventh auxiliary contact opening 2007' disposed on a periphery of light-emitting element C7 to expose the first semiconductor layer 21. A seventh auxiliary lower electrode 5017' is disposed on the seventh auxiliary contact opening 2007' to electrically contact the first semiconductor layer 21. The seventh auxiliary contact opening 2007' and the seventh auxiliary lower electrode 5017' are covered by the seventh bottom electrode portion 771. One or the plurality of seventh upper electrodes 5027 is disposed on the seventh conductive layer 407, and the seventh current blocking layer 307 is formed under the seventh conductive layer 407. The light-emitting element C7 further includes the seventh top electrode portion 772 formed on the seventh mesa 207 to contact the one or the plurality of seventh upper electrodes 5027 through the one or the plurality of seventh upper opening 6027. The one or the plurality of upper electrodes 5027 is cover by the first electrode pad 91, and the passivation layer 80 is formed between the first electrode pad 91 and the one or the plurality of upper electrodes 5027.

Figure 9:
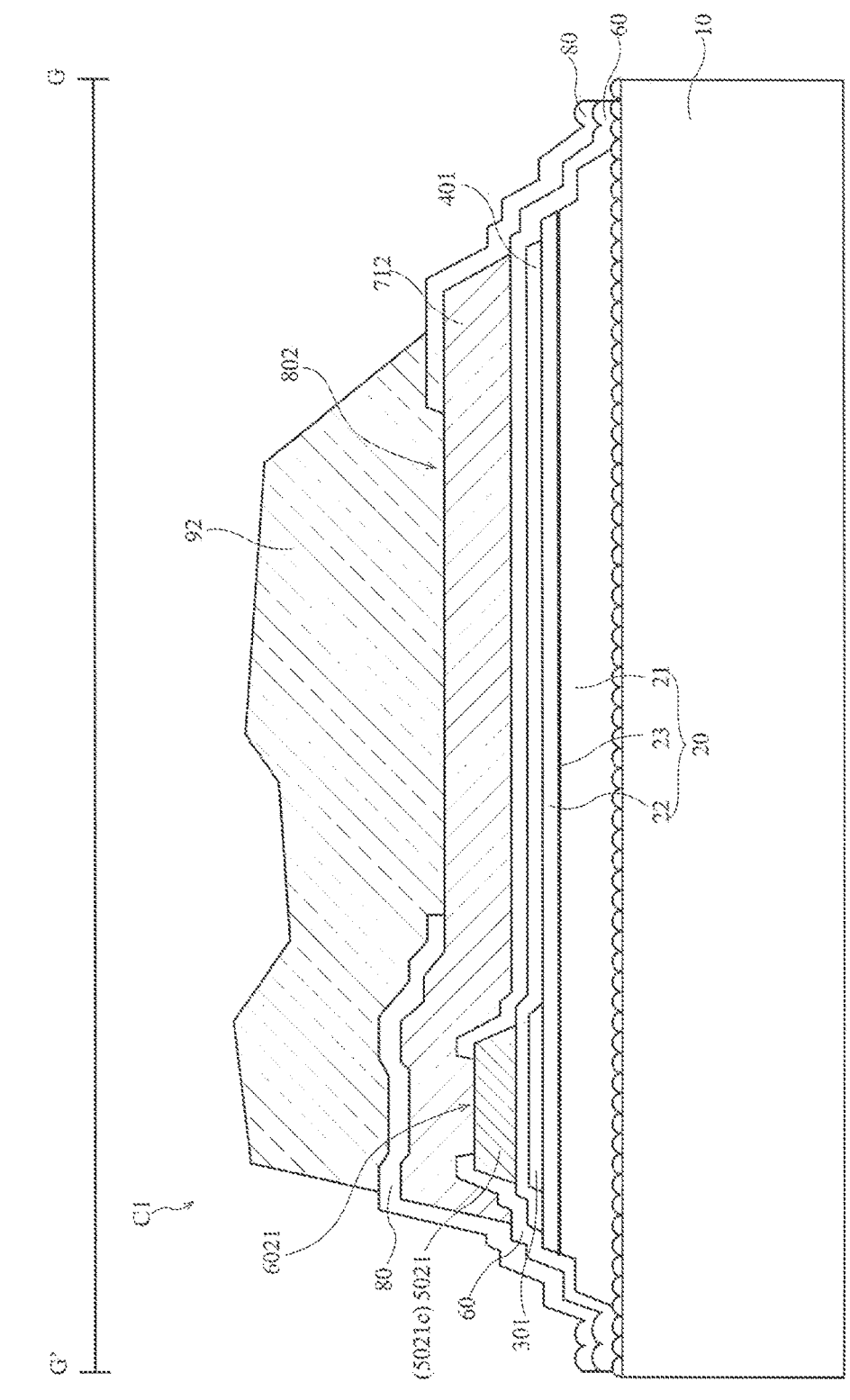
FIG. 9 illustrates a cross-sectional view taken along line G-G' of FIG. 1.

FIG. 9 illustrates the cross-sectional view taken along line G-G' of FIG. 1. The light-emitting device 1 includes the plurality of light-emitting elements, for example C1 to C7, and the plurality of light-emitting elements is electrically connected in series. The passivation layer 80 includes one or the plurality of second passivation openings 802 exposing the top electrode portion of the first one light-emitting element in the series connecting light-emitting elements, such as the first top electrode portion 712 on the first light-emitting element C1. As shown in FIG. 1 and FIG. 9, the plurality of second passivation openings 802 is disposed on two sides of the first upper electrode 5021 or between the first upper electrodes 5021 to expose the first top electrode portion 712. The second electrode pad 92 is electrically connected to the second semiconductor layer 22 of the first light-emitting element C1 through the one or the plurality of second passivation openings 802 to contact the first top electrode portion 712.

Figure 10:
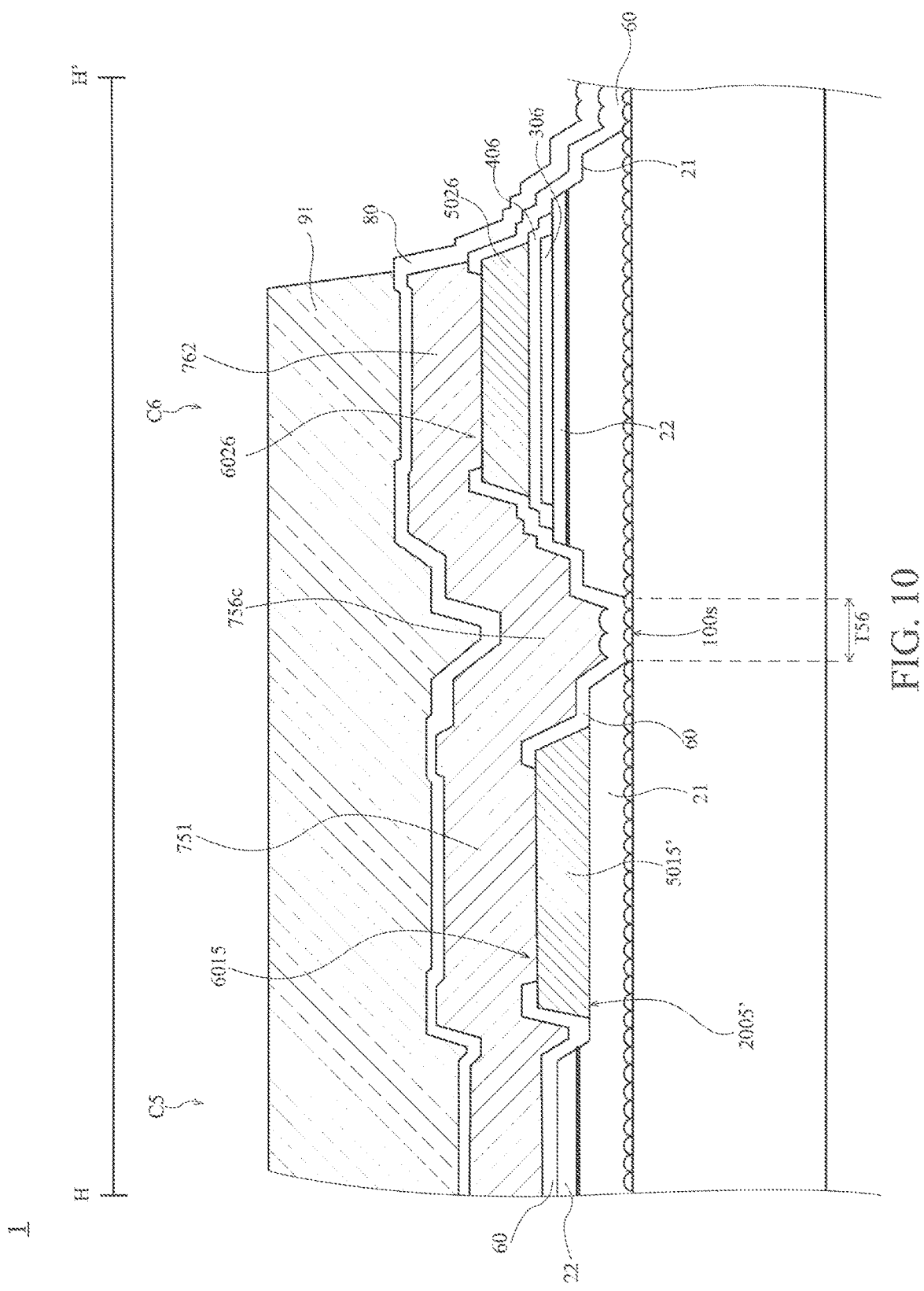
FIG. 10 illustrates a cross-sectional view taken along line H-H' of FIG. 1.

FIG. 10 illustrates the cross-sectional view taken along line H-H' of FIG. 1. The light-emitting element C5 includes the fifth auxiliary contact opening 2005' disposed on a periphery of the light-emitting element C5 to expose the first semiconductor layer 21. The fifth auxiliary lower electrode 5015' is disposed on the fifth auxiliary contact opening 2005' to electrically contact the first semiconductor layer 21. The fifth auxiliary contact opening 2005' and the fifth auxiliary lower electrode 5015' are covered by the fifth bottom electrode 751. The light-emitting element C6 includes one or the plurality of sixth upper electrodes 5026 disposed on the sixth conductive layer 406, and the sixth current blocking layer 306 is formed under the sixth conductive layer 406. The light-emitting element C6 further includes the sixth top electrode 762 formed on the sixth mesa 206 to contact the sixth upper electrode 5026 through the one or the plurality of sixth upper openings 6026. The one or the plurality of sixth upper electrodes 5026 is cover by the first electrode pad 91, and the passivation layer 80 is formed between the first electrode pad 91 and the one or the plurality of sixth upper electrodes 5026.

Figure 11:
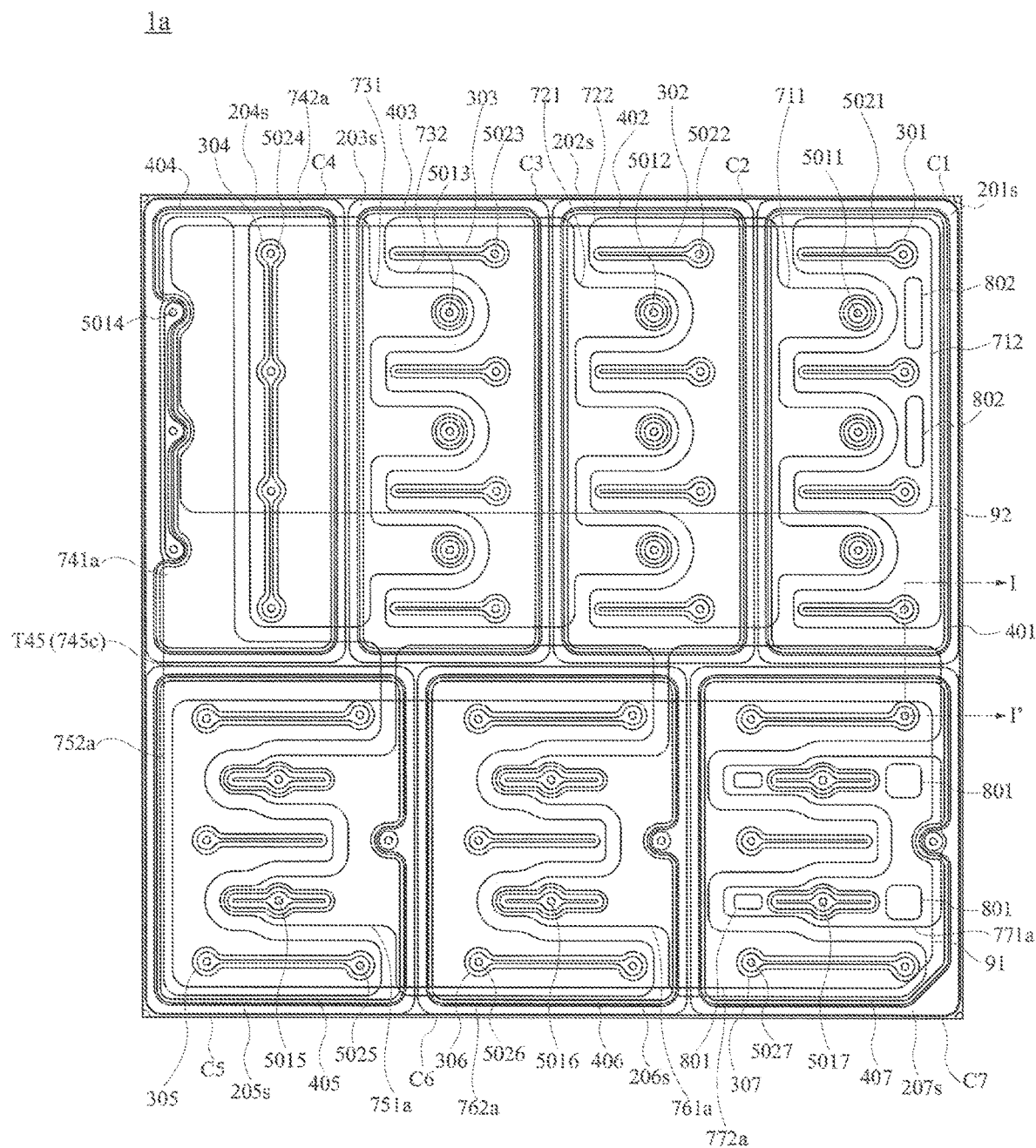
FIG. 11 illustrates a top view of a light-emitting device 1a in accordance with an embodiment of the present application.
Figure 12:
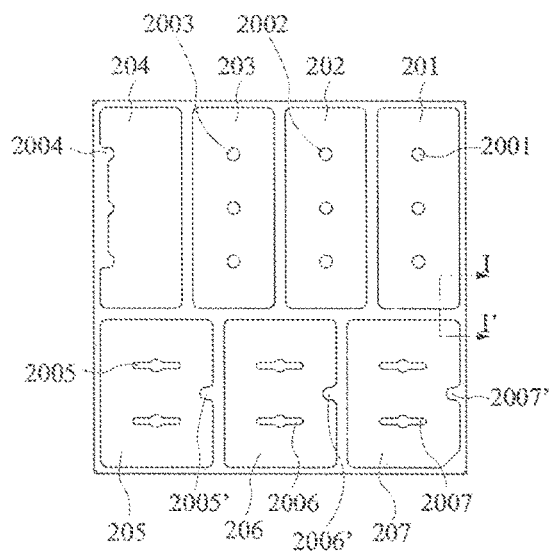
FIG. 12 illustrates top views of layers of the light-emitting device 1a of FIG. 11.
Figure 12:
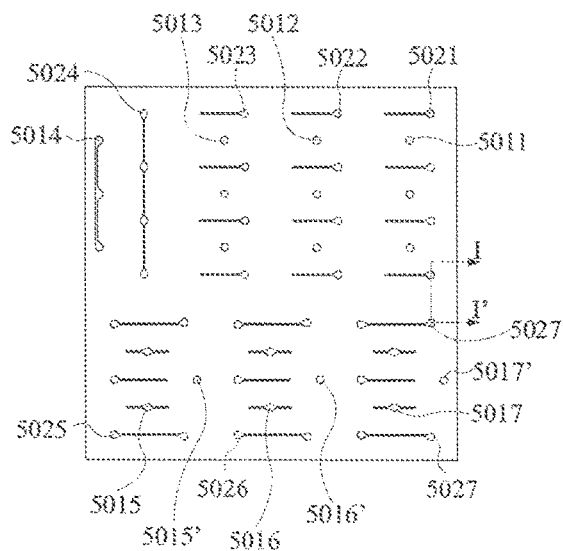
Figure 12:
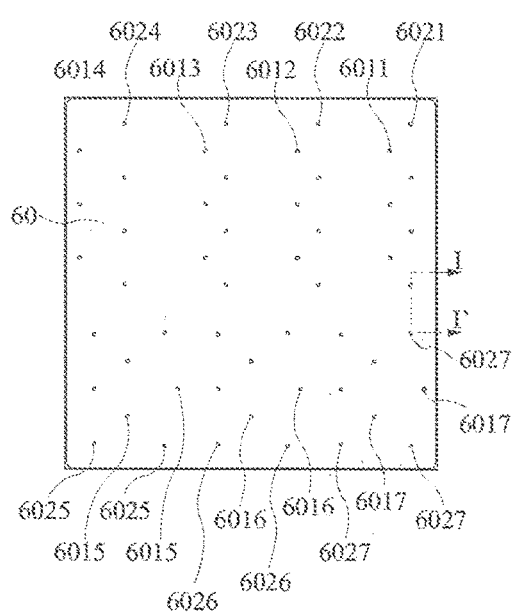
Figure 12:
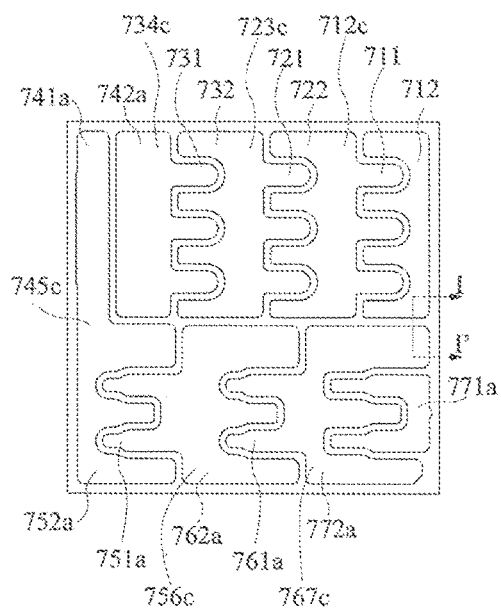
Figure 13:
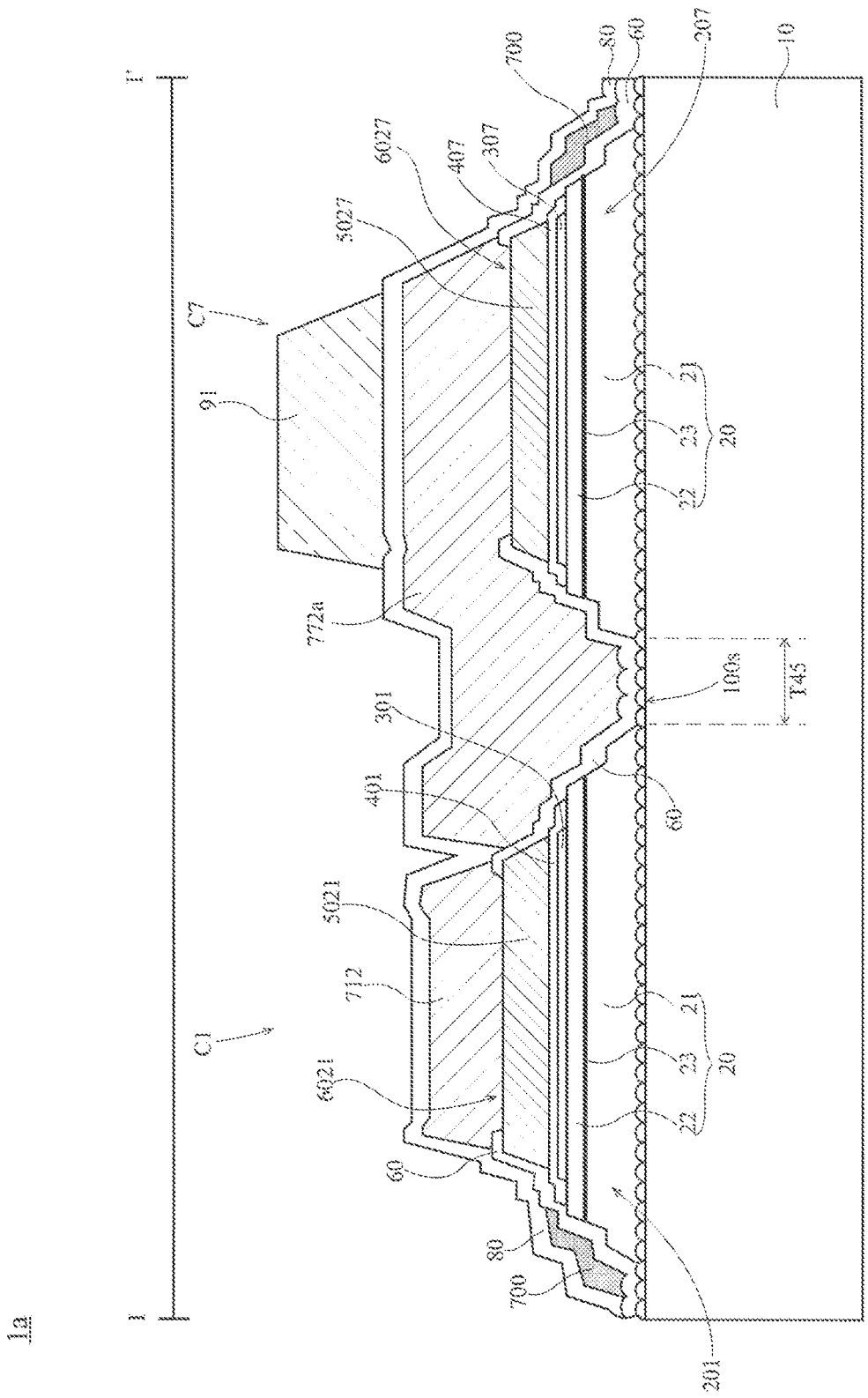
FIG. 13 illustrates a cross-sectional view taken along line I-I' of FIG. 11.

FIG. 11 illustrates a top view of a light-emitting device 1a in accordance with an embodiment of the present application. FIG. 12 illustrates top views of layers of the light-emitting device 1a of FIG. 11. FIG. 13 illustrates a cross-sectional view taken along line I-I' of FIG. 11. The light-emitting device 1a according to this embodiment is similar to the light-emitting device 1 with reference to FIG. 1 to FIG. 10 except for the structure of the top electrode portion and the bottom electrode portion.

As shown in FIG. 11, FIG. 12 and FIG. 13, the light-emitting device 1a includes the substrate 10 including the top surface 100s; and the plurality of light-emitting elements C1, C2, C3, C4, C5, C6 and C7 formed on the top surface 100s of the substrate 10, wherein the plurality of light-emitting elements C1, C2, C3, C4, C5, C6 and C7 each includes the semiconductor stack 20. The semiconductor stack 20 includes the first semiconductor layer 21, the active layer 23 and the second semiconductor layer 22. The first plurality of light-emitting elements, such as the first light-emitting element C1, the second light-emitting element C2, the third light-emitting element C3 and the fourth light-emitting element C4, is arranged on the first column. The second plurality of light-emitting elements, such as the fifth light-emitting element C5, the sixth light-emitting element C6 and the seventh light-emitting element C7, is arranged on the second column. The first plurality of light-emitting elements C1 to C4 and the second plurality of light-emitting elements C5 to C7 are separated by the fourth trench T45. The first plurality of light-emitting elements and the second plurality of light-emitting elements are electrically connected by the fourth connecting electrode portion 745c formed on the fourth trench T45.

The top view of the electrode layout of the bottom electrode portion and the top electrode portion of the light-emitting elements C1 to C3 of the light-emitting device 1a is same as that of the light-emitting device 1. The top view of the electrode layout of the bottom electrode portion and the top electrode portion of the light-emitting elements C4 to C7 of the light-emitting device 1a is different from that of the light-emitting device 1.

The fourth light-emitting element C4 includes the fourth bottom electrode portion 741a and the fourth top electrode portion 742a. The fifth light-emitting element C5 includes the fifth bottom electrode portion 751a and the fifth top electrode portion 752a. The sixth light-emitting element C6 includes the sixth bottom electrode portion 761a and the sixth top electrode portion 762a. The seventh light-emitting element C7 includes the seventh bottom electrode portion 771a and the seventh top electrode portion 772a.

The fourth bottom electrode portion 741a on the fourth light-emitting element C4 continuously connects the fifth top electrode portion 752a on the fifth light-emitting element C5. With reference to the fifth top electrode portion 752 of the light-emitting device 1, as shown in FIG. 1 and FIG. 11, the fifth top electrode portion 752a of the fifth light-emitting element C5 of the light-emitting device 1a extends to cover the third light-emitting element C3 and the fourth light-emitting element C4. And, the fifth bottom electrode portion 751a of the light-emitting device 1a extends to cover the third light-emitting element C3. The passivation layer 80 is formed on the extending portion of the fifth top electrode portion 752a and the fifth bottom electrode portion 751a. A ratio of the surface area of the fifth top electrode portion 752a to that of the fifth bottom electrode portion 751a is between 1.1~1.6, preferably between 1.2~1.5, and more preferably between 1.25~1.45. The fifth bottom electrode portion 751a is separated from the fifth top electrode portion 752a by a shortest distance smaller than 100 µm, preferably smaller than 80 µm, and preferably smaller than 70 µm. The shortest distance between the fifth top electrode portion 752a and the fifth bottom electrode portion 751a is larger than 10 µm, preferably larger than 20 µm, and preferably larger than 30 µm.

With reference to the sixth top electrode portion 762 of the light-emitting device 1, as shown in FIG. 1 and FIG. 11, the sixth top electrode portion 762a of the light-emitting device 1a extends to cover the second light-emitting element C2 and the third light-emitting element C3. And, the sixth bottom electrode portion 761a of the light-emitting device 1a extends to cover the second light-emitting element C2. The passivation layer 80 is formed on the sixth top electrode portion 762a and the sixth bottom electrode portion 761a. A ratio of the surface area of the sixth top electrode portion 762a to that of the sixth bottom electrode portion 761a is between 1.1~1.6, preferably between 1.2~1.5, and more preferably between 1.25~1.45. The sixth bottom electrode portion 761a is separated from the sixth top electrode portion 762a by a shortest distance smaller than 100 µm, preferably smaller than 80 µm, and preferably smaller than 70 µm. The shortest distance between the sixth top electrode portion 762a and the sixth bottom electrode portion 761a is larger than 10 µm, preferably larger than 20 µm, and preferably larger than 30 µm.

With reference to the seventh top electrode portion 772 of the light-emitting device 1, as shown in FIG. 1 and FIG. 11, the seventh top electrode portion 772a of the light-emitting device 1a extends to cover the first light-emitting element C1 and the second light-emitting element C2. The passivation layer 80 is formed on the extending portion of the seventh top electrode portion 772a. A ratio of the surface area of the seventh top electrode portion 772a to that of the seventh bottom electrode portion 771a is between 1.1~1.6, preferably between 1.2~1.5, and more preferably between 1.25~1.45. The seventh bottom electrode portion 771a is separated from the seventh top electrode portion 772a by a shortest distance smaller than 100 µm, preferably smaller than 80 µm, and preferably smaller than 70 µm. The shortest distance between the seventh top electrode portion 772a and the seventh bottom electrode portion 771a is larger than 10 µm, preferably larger than 20 µm, and preferably larger than 30 µm.

In an embodiment, a first shortest distance between the top electrode portion and the bottom electrode portion of each light-emitting element is larger or smaller than, or same as a second shortest distance between two adjacent top electrode portions of two light-emitting elements in different columns. For example, the first shortest distance between the first top electrode portion 712 and the first bottom electrode portion 711 of the first light-emitting element C1, the second top electrode portion 722 and the second bottom electrode portion 721 of the second light-emitting element C2, or the sixth top electrode portion 762a and the sixth bottom electrode portion 761a of the sixth light-emitting element C6 is larger than the second shortest distance between the second top electrode portion 722 of the second light-emitting element C2 and the sixth top electrode portion 762a of the sixth light-emitting element C6, or the third top electrode portion 732 of the third light-emitting element C3 and the sixth top electrode portion 762a of the sixth light-emitting element C6 in the different columns.

For example, the first shortest distance between the first top electrode portion 712 and the first bottom electrode portion 711, the second top electrode portion 722 and the second bottom electrode portion 721, or the sixth top electrode portion 762a and the sixth bottom electrode portion 761a of each light-emitting element is larger or smaller than, or same as a third shortest distance between the second bottom electrode portion 721 and the sixth top electrode portion 762a, or the first top electrode portion 711 and the seventh top electrode portion 772a of two light-emitting elements in different columns.

In an embodiment, the first shortest distance is between 10 µm~100 µm, preferably between 30 µm~90 µm, more preferably between 40 µm~80 µm, and the first shortest distance is between 10 µm~100 µm, preferably between 15 µm~70 µm, more preferably between 20 µm~50 µm, In an embodiment, the third shortest distance is smaller than 50 µm and larger than 10 µm.

As shown in FIG. 13, the seventh top electrode portion 772a includes one portion formed on the seventh light-emitting element C7. The portion of the seventh top electrode portion 772a contacts the seventh upper electrodes 5027 through the one or the plurality of seventh upper opening 6027 to electrically connect the second semiconductor layer 22 of the seventh mesa 207 of the seventh light-emitting element C7. The seventh top electrode portion 772a covers the fourth trench T45 between the first light-emitting element C1 and the seventh light-emitting element C7. The seventh top electrode portion 772a includes other portion formed on the first mesa 201 of the first light-emitting element C1. The insulating layer 60 is formed between the seventh top electrode portion 772a and the first mesa 201 of the first light-emitting element C1. The passivation layer 80 is formed on and between the first top electrode portion 712 and the seventh top electrode portion 772a to electrically isolate the first top electrode portion 712 and the seventh top electrode portion 772a.

In an embodiment of the present application, the light-emitting device 1 or 1a further includes a metal layer 700 covering a sidewall of the light-emitting elements C1 to C7. As shown in FIG. 13, the sidewall of each of the light-emitting elements C1 to C7 is covered by the metal layer 700, the metal layer 700 is formed between the insulating layer 60 and the passivation layer 80, and the metal layer 700 is electrically insulated from the light-emitting elements C1 to C7.

Figure 14:
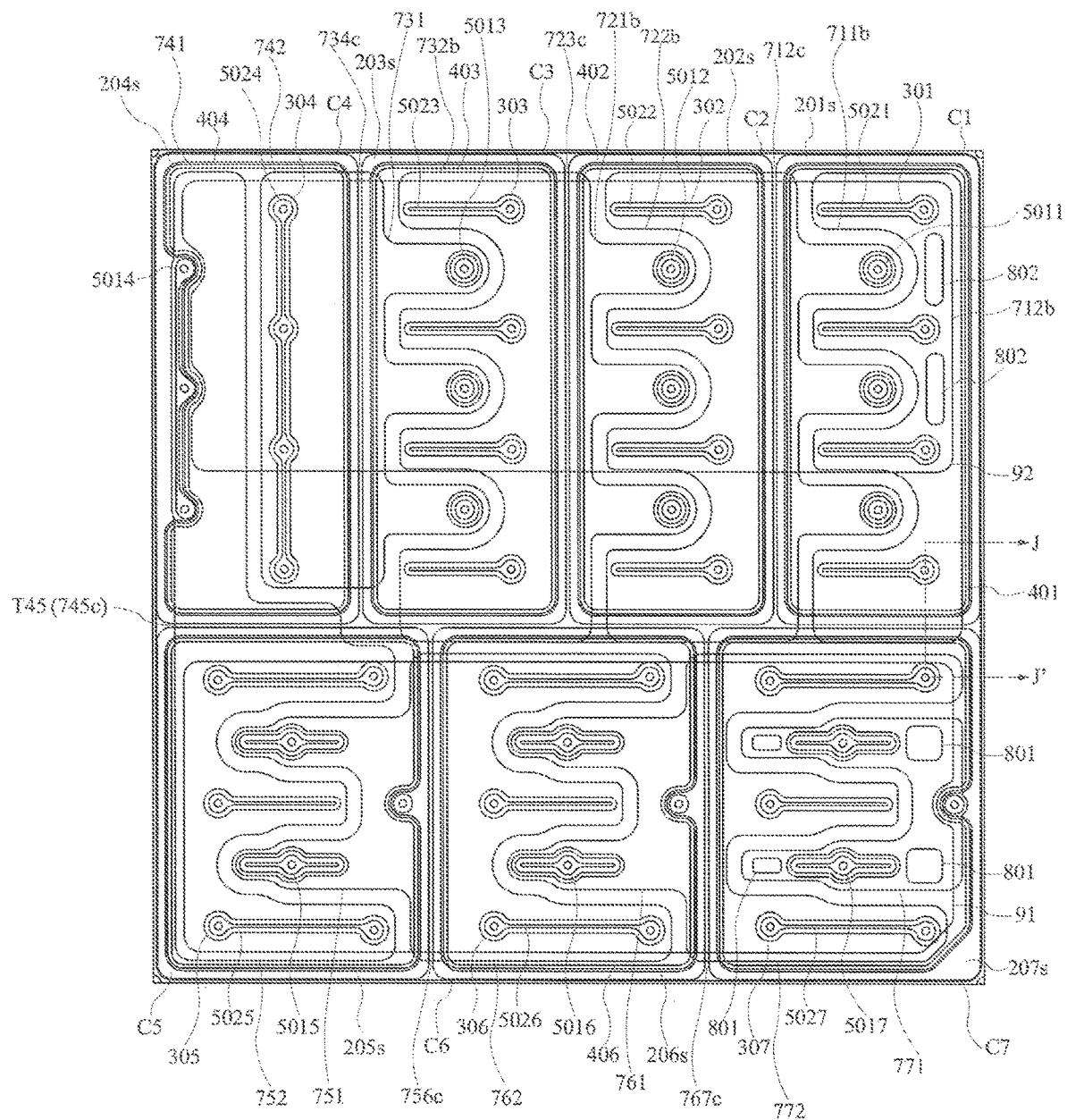
FIG. 14 illustrates a top view of a light-emitting device 1b in accordance with an embodiment of the present application.
Figure 15:
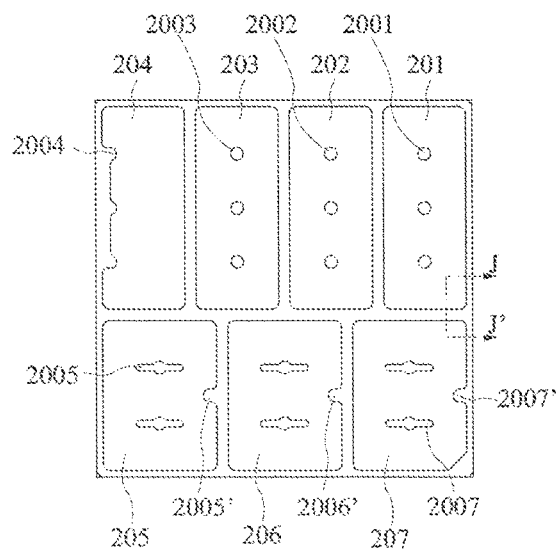
FIG. 15 illustrates top views of layers of the light-emitting device 1b of FIG. 14.
Figure 15:
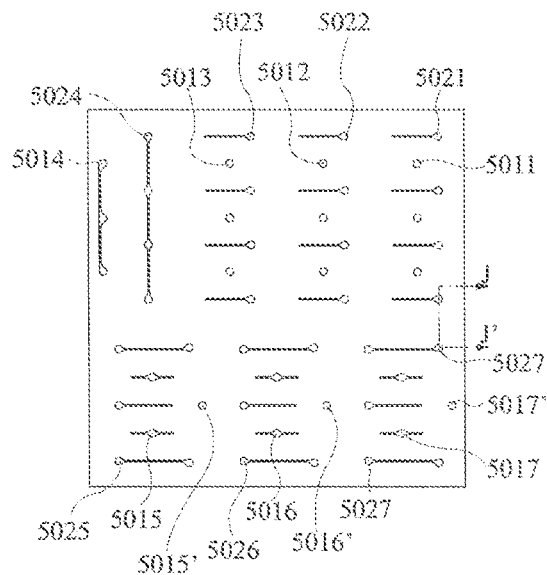
Figure 15:
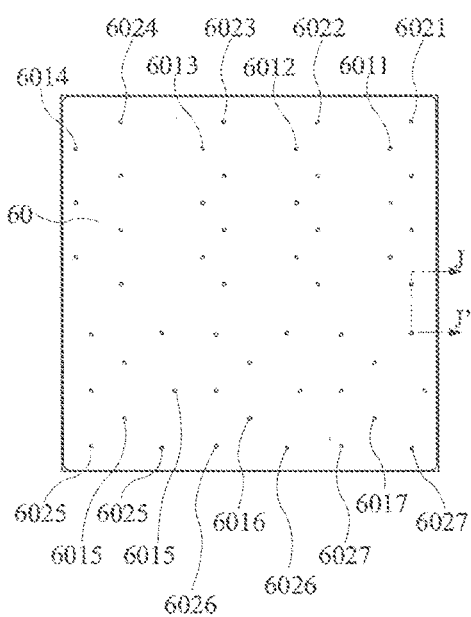
Figure 15:
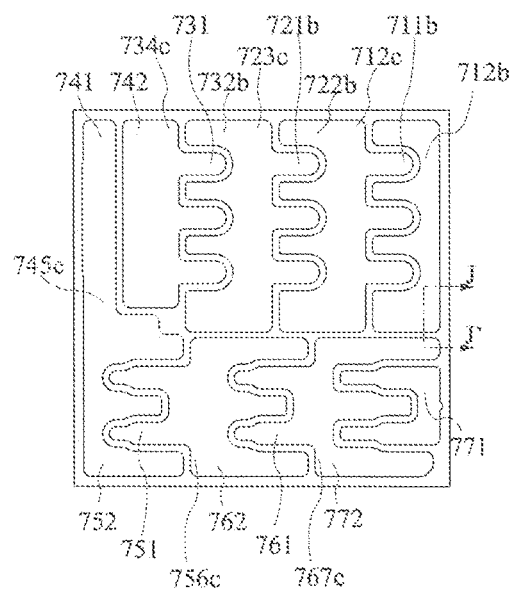
Figure 16:
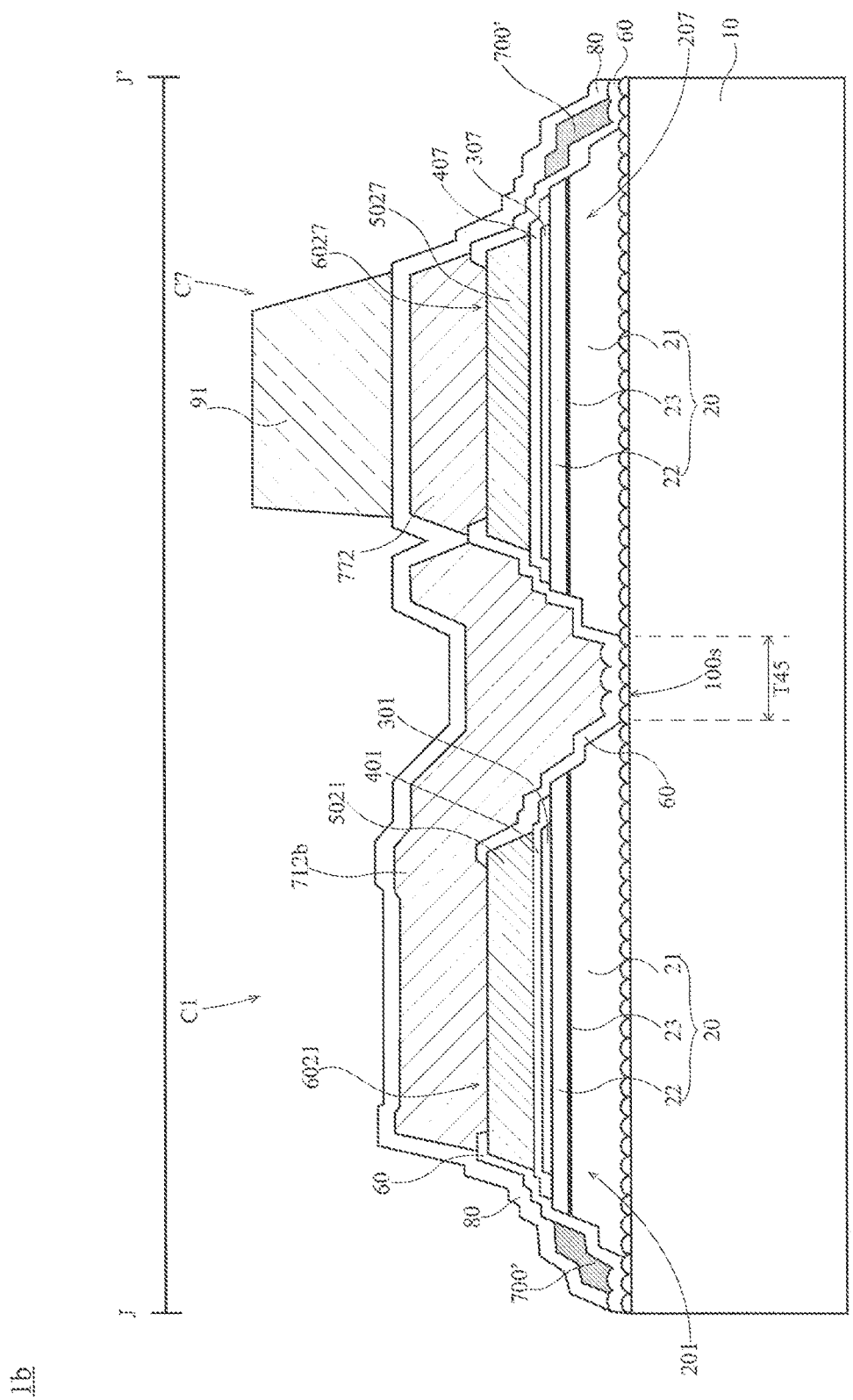
FIG. 16 illustrates a cross-sectional view taken along line J-J' of FIG. 14.

FIG. 14 illustrates a top view of a light-emitting device 1b in accordance with an embodiment of the present application. FIG. 15 illustrates top views of layers of the light-emitting device 1b of FIG. 14. FIG. 16 illustrates a cross-sectional view taken along line J-J' of FIG. 14. The light-emitting device 1b according to this embodiment is similar to the light-emitting device 1 with reference to FIG. 1 to FIG. 10 except for the structure of the top electrode portion and the bottom electrode portion.

As shown in FIG. 14, FIG. 15 and FIG. 16, the light-emitting device 1b includes the substrate 10 including the top surface 100s; and the plurality of light-emitting elements C1, C2, C3, C4, C5, C6 and C7 formed on the top surface 100s of the substrate 10, wherein the plurality of light-emitting elements C1, C2, C3, C4, C5, C6 and C7 each includes the semiconductor stack 20. The semiconductor stack 20 includes the first semiconductor layer 21, the active layer 23 and the second semiconductor layer 22. The first plurality of light-emitting elements, such as the first light-emitting element C1, the second light-emitting element C2, the third light-emitting element C3 and the fourth light-emitting element C4, is arranged on the first column. The second plurality of light-emitting elements, such as the fifth light-emitting element C5, the sixth light-emitting element C6 and the seventh light-emitting element C7, is arranged on the second column. The first plurality of light-emitting elements C1 to C4 and the second plurality of light-emitting elements C5 to C7 are separated by the fourth trench T45. The first plurality of light-emitting elements and the second plurality of light-emitting elements are electrically connected by the fourth connecting electrode portion 745c formed on the fourth trench T45.

The top view of the electrode layout of the bottom electrode portion and the top electrode portion of the light-emitting elements C1 to C3 of the light-emitting device 1b is different from that of the light-emitting device 1. The top view of the electrode layout of the bottom electrode portion and the top electrode portion of the light-emitting elements C4 to C7 of the light-emitting device 1b is same as that of the light-emitting device 1.

The first light-emitting element C1 includes the first bottom electrode portion 711b and the first top electrode portion 712b. The second light-emitting element C2 includes the second bottom electrode portion 721b and the second top electrode portion 722b. The third light-emitting element C3 includes the third bottom electrode portion 731b and the third top electrode portion 732b.

With reference to the first top electrode 712 of the light-emitting device 1, as shown in FIG. 14, the first top electrode portion 712b of the light-emitting device 1b extends to cover the seventh light-emitting element C7. With reference to the first bottom electrode portion 711 of the light-emitting device 1, as shown in FIG. 1 and FIG. 14, the first bottom electrode portion 711b of the light-emitting device 1b extends to cover the seventh light-emitting element C7. The passivation layer 80 is formed on the extending portion of the first top electrode portion 712b and the first bottom electrode portion 711b.

With reference to the second top electrode portion 722 of the light-emitting device 1, as shown in FIG. 1 and FIG. 14, the second top electrode portion 722b of the light-emitting device 1b extends to cover the sixth light-emitting element C6 and the seventh light-emitting element C7. With reference to the second bottom electrode portion 721 of the light-emitting device 1, as shown in FIG. 1 and FIG. 14, the second bottom electrode portion 721b of the light-emitting device 1b extends to cover the sixth light-emitting element C6. The passivation layer 80 is formed on the extending portion of the second top electrode portion 722b and the second bottom electrode portion 721b.

With reference to the third top electrode portion 732 of the light-emitting device 1, as shown in FIG. 1 and FIG. 14, the third top electrode portion 732b of the light-emitting device 1b extends to cover the fifth light-emitting element C5 and the sixth light-emitting element C6. The passivation layer 80 is formed on the extending portion of the third top electrode portion 732b.

As shown in FIG. 16, the first top electrode portion 712b includes one portion formed on the first light-emitting element C1. The portion of the first top electrode portion 712b contacts the one or the plurality of first upper electrodes 5021 through the one or the plurality of first upper opening 6021 to electrically connect the second semiconductor layer 22 of the first mesa 201 of the first light-emitting element C1. The first top electrode portion 712b covers the fourth trench T45 between the first light-emitting element C1 and the seventh light-emitting element C7. The first top electrode portion 712b includes other portion formed on the seventh mesa 207 of the seventh light-emitting element C7. The insulating layer 60 is formed between first top electrode portion 712b and the seventh mesa 207 of the seventh light-emitting element C7. The passivation layer 80 is formed on and between the first top electrode portion 712b and the seventh top electrode portion 772 to electrically isolate the first top electrode portion 712b and the seventh top electrode portion 772.

In an embodiment of the present application, the light-emitting device 1 or 1b further includes a metal layer 700 covering sidewalls of the light-emitting elements C1 to C7 to prevent the moisture into the interior of the light-emitting device and deteriorate the stability of the light-emitting device. As shown in FIG. 16, the sidewall of each of the light-emitting elements C1 to C7 is covered by the metal layer 700, the metal layer 700 is formed between the insulating layer 60 and the passivation layer 80, and the metal layer 700 is electrically insulated from the light-emitting elements C1 to C7.

Figure 17:
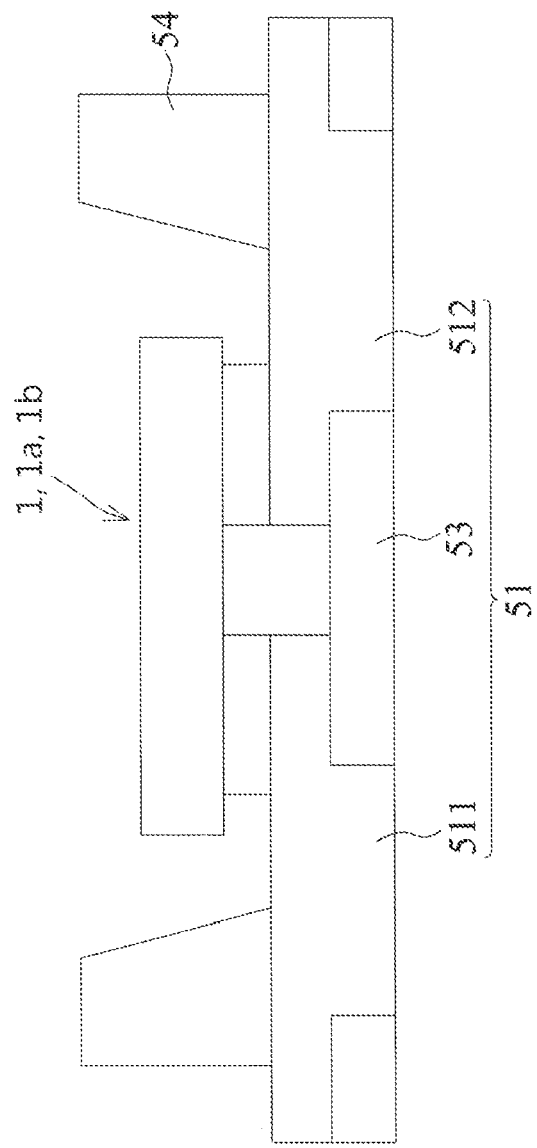
FIG. 17 illustrates a schematic view of a light-emitting apparatus 2 in accordance with an embodiment of the present application.

FIG. 17 is a schematic view of a light-emitting apparatus 2 in accordance with an embodiment of the present application. The light-emitting device 1, 1a, or 1b in the foregoing embodiment is mounted on the first spacer 511 and the second spacer 512 of the package substrate 51 in the form of flip chip. The first spacer 511 and the second spacer 512 are electrically insulated from each other by an insulating portion 53 including an insulating material. The main light-extraction surface of the flip chip is one side of the growth substrate opposite to the electrode-forming surface where the electrodes are formed on. A reflective structure 54 can be provided around the light-emitting device 1, 1a, or 1b to increase the light extraction efficiency of the light-emitting apparatus 2.

Figure 18:
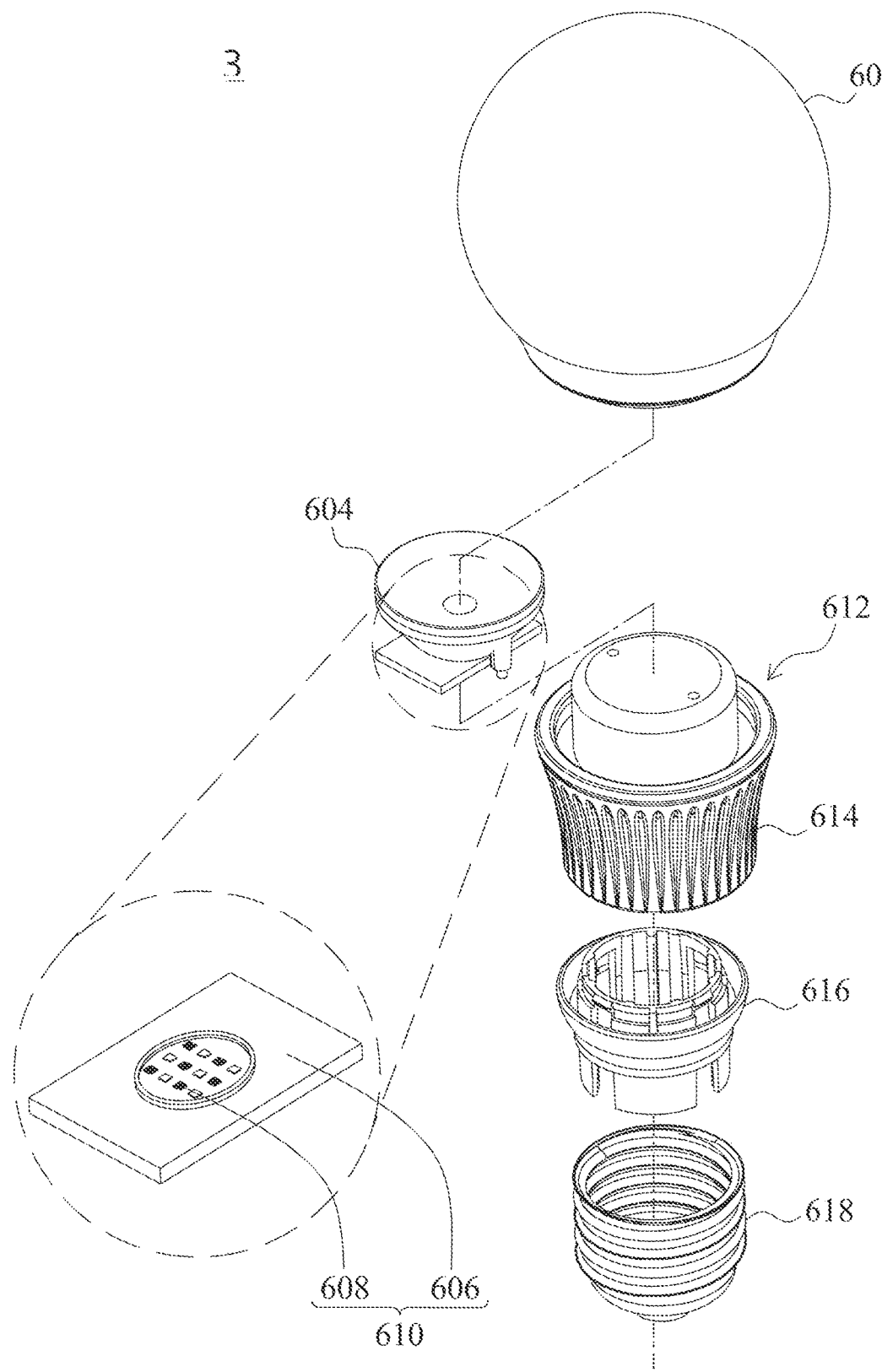
FIG. 18 illustrates a schematic view of a light-emitting apparatus 3 in accordance with an embodiment of the present application.

FIG. 18 illustrates a structure diagram of a light-emitting apparatus 3 in accordance with an embodiment of the present application. A light bulb includes an envelope 602, a lens 604, a light-emitting module 610, a base 612, a heat sink 614, a connector 616 and an electrical connecting device 618. The light-emitting module 610 includes a submount 606 and a plurality of light-emitting devices 608 on the submount 606, wherein the plurality of light-emitting devices 608 can be the light-emitting device 1, 1a, or 1b, or the light-emitting apparatus 2 described in above embodiments.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:
1. A light-emitting device, comprising:
a substrate comprising a top surface;
a plurality of light-emitting elements formed on the substrate, wherein the plurality of light-emitting elements comprises a first light-emitting element and a second light-emitting element, wherein each of the plurality of light-emitting elements comprises a first semiconductor layer, and a mesa comprising a second semiconductor layer and an active layer formed on the first semiconductor layer;
a first bottom electrode portion formed on the first light-emitting element and electrically connecting the first semiconductor layer of the first light-emitting element;
a first top electrode portion formed on the first light-emitting element and electrically connecting the second semiconductor layer of the first light-emitting element, wherein a first ratio of a first surface area of the first top electrode portion to that of the first bottom electrode portion on the first light-emitting element is between 1.1 and 1.6;

a second bottom electrode portion formed on the second light-emitting element and electrically connecting the first semiconductor layer of the second light-emitting element; and a second top electrode portion formed on the second light-emitting element and electrically connecting the second semiconductor layer of the second light-emitting element.

2. The light-emitting device according to claim 1, wherein the first bottom electrode portion and the first top electrode portion each comprises a comb shape.

3. The light-emitting device according to claim 2, wherein the second bottom electrode portion and the second top electrode portion each comprises a comb shape.

4. The light-emitting device according to claim 1, wherein the first bottom electrode portion or the first top electrode portion each comprises a comb shape.

5. The light-emitting device according to claim 1, further comprising a connecting electrode portion electrically connect the first bottom electrode portion on the first light-emitting element and the second top electrode portion on the second light-emitting element.

6. The light-emitting device according to claim 1, wherein the first bottom electrode portion is separated from the first top electrode portion by a shortest distance smaller than 50 μm and larger than 10 μm.

7. The light-emitting device according to claim 1, wherein the first ratio of the first surface area of the first top electrode portion to that of the first bottom electrode portion on the first light-emitting element is between 1.2 and 1.5.

8. The light-emitting device according to claim 1, further comprising a first electrode pad formed on a first plurality of light-emitting elements and a second electrode pad formed on a second plurality of light-emitting elements, wherein the first plurality of light-emitting elements comprises different amount from that of the second plurality of light-emitting elements.

9. The light-emitting device according to claim 1, further comprising a first electrode pad formed on a first plurality of light-emitting elements and a second electrode pad formed on a second plurality of light-emitting elements, wherein the first plurality of light-emitting elements comprises same amount as that of the second plurality of light-emitting elements.

10. The light-emitting device according to claim 1, further comprising a first lower electrode formed on the first semiconductor layer of the first light-emitting element and a first upper electrode formed on the second semiconductor layer of the first light-emitting element.

11. The light-emitting device according to claim 10, further comprising a second lower electrode formed on the first semiconductor layer of the second light-emitting element and a second upper electrode formed on the second semiconductor layer of the second light-emitting element.

12. The light-emitting device according to claim 11, further comprising a first current blocking layer formed under the first upper electrode, and a second current blocking layer formed under the second upper electrode.

13. The light-emitting device according to claim 12, further comprising a first conductive layer formed between the first current blocking layer and the first upper electrode, and a second conductive layer formed between the second current blocking layer and the second upper electrode.

14. The light-emitting device according to claim 1, further comprising an insulating layer covering the plurality of light-emitting elements, wherein the insulating layer comprises a Distributed Bragg Reflector (DBR).

15. The light-emitting device according to claim 1, further comprising an insulating layer covering the plurality of light-emitting elements, wherein the insulating layer comprises a first most outside edge separated from an edge of the substrate by a distance between 5 μm and 60 μm.

16. The light-emitting device according to claim 1, further comprising a street surrounding the light-emitting device, wherein the street exposes a portion of the top surface of the substrate.

17. The light-emitting device according to claim 1, further comprising a metal layer formed on a sidewall of the plurality of light-emitting elements, wherein the metal layer is insulated from the plurality of light-emitting elements.

18. The light-emitting device according to claim 1, wherein each of the plurality of light-emitting elements comprises a surrounding part comprising the first semiconductor layer surrounding the mesa.

19. The light-emitting device according to claim 4, wherein the first bottom electrode portion comprises bottom branches and the first top electrode portion comprises top branches.

20. The light-emitting device according to claim 19, wherein the bottom branches comprise a width larger or smaller than that of the top branches.

* * * * *